(12) United States Patent
Misu et al.

(10) Patent No.: US 6,586,861 B2
(45) Date of Patent: Jul. 1, 2003

(54) FILM BULK ACOUSTIC WAVE DEVICE

(75) Inventors: Koichiro Misu, Tokyo (JP); Kenji Yoshida, Tokyo (JP); Koji Ibata, Tokyo (JP); Shusou Wadaka, Tokyo (JP); Tsutomu Nagatsuka, Tokyo (JP); Fusaoki Uchikawa, Tokyo (JP); Akira Yamada, Tokyo (JP); Chisako Maeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/892,606

(22) Filed: Jun. 28, 2001

(65) Prior Publication Data

US 2001/0045793 A1 Nov. 29, 2001

Related U.S. Application Data

(63) Continuation of application No. PCT/JP00/02960, filed on May 9, 2000.

(30) Foreign Application Priority Data

Nov. 11, 1999 (JP) ............................................. 11-321594

(51) Int. Cl.$^7$ ............................................. H01L 41/047
(52) U.S. Cl. ........................................ 310/324; 310/365
(58) Field of Search ................................. 310/324, 330, 310/363, 369, 365

(56) References Cited

U.S. PATENT DOCUMENTS

| | | | | |
|---|---|---|---|---|
| 3,755,720 A | * | 8/1973 | Kern | 257/794 |
| 4,320,365 A | * | 3/1982 | Black et al. | 333/187 |
| 4,531,267 A | * | 7/1985 | Royer | 29/25.35 |
| 4,642,508 A | * | 2/1987 | Suzuki et al. | 310/321 |
| 4,719,383 A | * | 1/1988 | Wang et al. | 310/324 |

(List continued on next page.)

FOREIGN PATENT DOCUMENTS

| | | |
|---|---|---|
| JP | B 58-58828 | 12/1983 |
| JP | A 4-263952 | 9/1992 |
| JP | A 6-350154 | 12/1994 |
| JP | A 8-51241 | 2/1996 |
| JP | A 9-130200 | 5/1997 |
| JP | A 9-223831 | 8/1997 |
| JP | A 10-135528 | 5/1998 |
| JP | A 10-315465 | 12/1998 |

OTHER PUBLICATIONS

Ruby et al, Micromachined Think Film Bulk Acoustic Resonator, 1994 IEEE Int'l Freq. Cont. Symp., Jan. 1994, pp. 135–138.*

Osbond et al, The Influence of ZnO and Electrode Thickness on the Performance of Thin Film Bulk Acoustic Wave Resonators 1999 IEEE Utrasonics Symp., Jan. 1999, pp. 911–914.*

(List continued on next page.)

Primary Examiner—Thomas M. Dougherty
(74) Attorney, Agent, or Firm—Birch, Stewart, Kolasch & Birch, LLP.

(57) ABSTRACT

There is provided a film bulk acoustic wave device comprising: a silicon substrate 1, a dielectric film 21 including a silicon nitride 16 formed on the substrate 1 and a silicon oxide 2 on the silicon nitride 16, a bottom electrode 3 formed on the dielectric film 21, a piezoelectric film 17 formed on the bottom electrode 3, and a top electrode 5 formed on the piezoelectric film 17, wherein a via hole is formed in such a manner that the thickness direction of a part of the silicon substrate 1 which is opposite to a region including a part where the top electrode 5 exists is removed from the bottom surface of the silicon substrate 1 to a boundary surface with the silicon nitride 16.

15 Claims, 19 Drawing Sheets

U.S. PATENT DOCUMENTS

| | | | | |
|---|---|---|---|---|
| 5,185,589 A | * | 2/1993 | Krishnaswamy et al. | ... 310/320 |
| 5,233,259 A | * | 8/1993 | Krishnaswamy et al. | ... 310/322 |
| 5,714,917 A | * | 2/1998 | Ella | 310/318 |
| 5,789,845 A | * | 8/1998 | Wadaka et al. | 310/311 |
| 5,853,601 A | * | 12/1998 | Krishaswamy et al. | 216/2 |
| 5,872,493 A | * | 2/1999 | Ella | 310/324 |
| 5,873,153 A | * | 2/1999 | Ruby et al. | 29/25.35 |
| 5,910,756 A | * | 6/1999 | Ella | 310/324 |
| 6,081,171 A | * | 6/2000 | Ella | 310/348 |
| 6,204,737 B1 | * | 3/2001 | Ella | 310/321 |
| 6,242,843 B1 | * | 6/2001 | Pohjonen et al. | 310/313 R |
| 6,271,619 B1 | * | 8/2001 | Yamada et al. | 310/324 |
| 6,388,544 B1 | * | 5/2002 | Ella | 333/188 |

OTHER PUBLICATIONS

Su et al, Edge Supported ZnO Thin Film Bulk Acoustic Wave Resonators and Filter Design, 2000 IEEE Int'l Freq. Cont. Symp., pp. 434–440.*

Misu et al, Film Bulk Acoustic Wave Filters Using Lead Titanate on Silicon Substrate, 1998 IEEE Ultrasonics Symp., pp. 1091–1094.*

Grudkowski, T.W. et al.: "Fundamental Mode VHF/UHG Bulk Acoustic Wave Resonators and Filters On Silicon" 1980 IEEE Ultrasonics Symposium pp.829–833.

Lakin, K.M. et al.: "UHF Composite Bulk Wave Resonaors" 1980 IEEE Ultrasonics Symposium pp 834–837.

Nakamura, Kiyoshi et al.: "A Piezoelectric Composite Resonator Consisting of a ZNO Film on an Anisotropically Etched Silicon Substrate" Proceeding of $1^{st}$ Symposium on Ultrasonic Electronics, Tokyo, 1980, JJAP, vol. 20(1981) Supplement 20–3, pp.111–114.

"Bulk–Acoustic–Wave Devices Using the Second–Order Thickness–Extensional Mode in Thin ZNO–SiO2 Composite Tilms on Si" Proceedings of The Acoustical Society of Japan, pp.691–692, Sep.–Oct. 1985.

"Fundamental Bulk Acoustic Resonators in GHZ Range" Proceedings of IEICE vol. 81, No. 5, pp.468–472, 1998–05.

The Basics of Solid Oscillation Theory, Supervised by Morio Onoe issued on Sep., 1982, Ohumu–sha, pp.189–232.

Landolt–bornstein, p.80, Springer–Verlag Berlin, 1981, Neue Serie (ed).

John Wiley & Sons.: Acoustic Fields and Waves in Solids A Wiley–Interscience Publication vol. I, pp.357–382.

Chronological Scientific Tables 1997 p.phy/19(439), pp. phy/26(447), National Astronomy Observatory (ed.).

* cited by examiner

FILM BULK ACOUSTIC WAVE DEVICE

CROSS-REFERENCE TO THE RELATED APPLICATION

This Application is a continuation of International Application No. PCT/JP00/02960, whose International filing date is May 9, 2000, the disclosures of which Application are incorporated by reference herein. The present application has not been published in English.

BACKGROUND OF THE INVENTION

1. Field of the Invention

The present invention relates to a film bulk acoustic device, using an acoustic wave, such as resonators and filters.

2. Description of the Prior Art

FIGS. 1 and 2 show this type of the conventional film bulk acoustic wave device as described in, for example, the literature "Bulk-Acoustic-Wave Devices using the Second-Order Thickness-Extensional Mode in Thin ZnO—SiO$_2$ Composite Films on Si", Proceedings of The Acoustical Society of Japan, pp. 691–692, September–October 1985 (hereinafter, referred to as reference 1), and the literature "Fundamental Bulk Acoustic Resonators in GHz Range", Proceedings of The Institutes of Electronics, Information and Communication Engineers, vol.81, No.5, pp.468–472, 1998 (hereinafter, referred to as reference 2). FIG. 1 is a top view, and FIG. 2 is a cross sectional view taken along line I—I in FIG. 1. In the figures, reference numeral 1 denotes a silicon (Si) substrate; 2 denotes a silicon oxide (SiO$_2$) formed on the silicon substrate 1; 3 denotes a bottom electrode formed on the silicon oxide 2; 4 denotes a piezoelectric film composed of zinc oxide (ZnO) formed on the bottom electrode 3; 5 denotes a top electrode, divided into input-side electrode 5a and output-side electrode 5b, formed on the piezoelectric film 4; and 6 denotes a via hole.

When a voltage is applied to the top electrode 5 and the bottom electrode 3, an electric field is generated in the piezoelectric film 4. At this time, an acoustic distortion in the piezoelectric film 4 is caused by the electric field. When the applied voltage is a signal of frequency f, this distortion also vibrates at the same frequency f and excites an acoustic wave. In the case of a structure as shown in FIGS. 1 and 2, the excited acoustic wave propagates in the thickness direction, and the acoustic wave propagated in the thickness direction is reflected on the respective air-contact surfaces on the surface of the top electrode 5 and the lower surface of the silicon oxide 2. Therefor, there occurs an acoustic resonance when a gap between the surface of the top electrode 5 and the lower surface of the silicon oxide film 2 is an integer multiple of the half wave length of the acoustic wave.

On the other hand, there also occurs the propagation of the acoustic wave in the direction parallel to the surface in the interior of the piezoelectric film. The acoustic wave in the piezoelectric film 4 at this moment comes to be a cut-off mode at a frequency lower than a certain frequency f$_0$, and comes to be a propagation mode at a frequency higher than the frequency f$_0$. The frequency f$_0$ is a cut-off frequency, and corresponds to a frequency in which the thickness 2 h of the piezoelectric film 4 coincides with a half wavelength of the acoustic wave propagating in the thickness direction in the piezoelectric film 4 when the two surfaces of the piezoelectric film 4 are free surfaces.

In the case of the electrode unit in which the top electrode 5 is present on the surface, the cut-off frequency $f_{m0}$ of the electrode unit is lower than the cut-off frequency $f_{f0}$ of a non-electrode unit provided with only the bottom electrode 3, due to the electrode thickness and mass load. Therefor, in the range of the frequencies $f_{f0}$ to $f_{m0}$, the acoustic wave is the propagation mode due to a higher frequency side than the cut-off frequency $f_{m0}$ in the electrode unit, while it is the cut-off mode due to a lower frequency side than the cut-off frequency $f_{f0}$ in the non-electrode unit. Hence, the acoustic wave propagating in parallel to the surface of the film 4 results in a state that an energy is trapped in the top electrode 5.

When the input-side electrode 5a and output-side electrode 5b of the top electrode 5 are set appropriately at a symmetric mode frequency providing the common potential, and at an asymmetric mode frequency providing potentials different from each other, an electric signal applied to the input-side electrode 5a is traveled to the output-side electrode 5b with low loss. Thus, the pass band of a filter is created.

The characteristics of such a filter are determined by the thickness 2 h of the piezoelectric film 4, the thickness of the top electrode 5, the thickness g of the silicon oxide 2, the shape of the top electrode 5, and a gap between the input-side electrode 5a and the output-side electrode 5b.

The reference 1 describes one example in which a normalized thickness (g/h) of the piezoelectric film 4 is 1.54 and 2.4, which is determined by the thickness 2 h of the piezoelectric film 4 and the thickness g of the silicon oxide 2. The reference 1 also represents that the design is made by focusing the temperature characteristics and the loss of the acoustic wave. In addition, the reference 1 designates to use an acoustic wave of the second mode. The acoustic wave is a fundamental mode (first mode) when a gap between the surface of the top electrode 5 and the back of the silicon oxide 2 is a half wave length of the acoustic wave, and an N-th mode (N: integer) corresponds to an N multiple of the wave length of the fundamental mode.

FIG. 3 shows this type of the conventional film bulk acoustic device described in, for example, JP-A 6-350154 (hereinafter, referred to as reference 3). FIG. 3 is a cross sectional view. Though the basic structure is the same as that shown in FIG. 2, a piezoelectric film 7 is composed of lead titanate-zirconate (PZT); a bottom electrode 3 is composed of a titanium (Ti) film 8 and a platinum (Pt) film 9; and a top electrode 5 is composed of a titanium film 10 and a gold (Au) film 11.

The reference 3 describes one example in which a normalized thickness (d/h) of the bottom electrode 3 is 1.0, which is determined by the thickness 2 h of the piezoelectric film 7 and the thickness d of the bottom electrode 3. In addition, the reference 3 designates that favorable piezoelectric characteristics may be performed by an appropriate composition ratio of lead titanate (PbTiO$_3$) and lead zirconate (PbZrO$_3$).

The piezoelectric film 7 composed of lead titanate-zirconate excites a thickness extension vibration as a main vibration. In this case, the acoustic wave propagating in parallel with the surface of the piezoelectric film 7 designates the dispersion characteristics as shown in FIG. 4. In FIG. 4, the horizontal axis corresponds to a normalized thickness of the piezoelectric film 7 which multiplies the wave number k of the acoustic wave propagating in parallel with the surface of the film 7, and the thickness of the piezoelectric film 7 together, that is, a normalized piezoelectric thickness (2 kh), while the vertical axis corresponds to a frequency.

In the figure, reference numeral 12 designates the characteristics of a first mode (TE1) of the thickness extension vibration; 13 designates the characteristics of a second mode (TS2) of the thickness shear vibration; 14 designates the characteristics of a third mode (TS3) of the thickness shear vibration; and 15 designates the characteristics of a second mode (TE2) of the thickness extension vibration. A range that the normalized piezoelectric substance thickness is a real number is a range that the acoustic wave is a propagation mode, while a range that the normalized piezoelectric substance thickness is an imaginary number is a range that the acoustic wave is a cut-off mode. In addition, the frequency at the crossing point with the vertical axis, such that the normalized thickness is zero, is a cut-off frequency $f_0$.

As is apparent from FIG. 4, the first mode (TE1) of the thickness extension vibration shows a characteristic that the frequency is made lower as the normalized piezoelectric substance thickness is larger in the vicinity of the vertical axis. In addition to lead zirconate titanate, this is also applied similarly in a piezoelectric film having the thickness extension vibration as a main vibration, constituting lead titanate ($PbTiO_3$), lithium tantalate ($LiTaO_3$), or a material having the Poisson's ratio of one-third or less.

When a characteristic like the first mode (TE1) of the thickness extension vibration in FIG. 4 is exhibited, the cut-off mode corresponds to a frequency higher than the cut-off frequency $f_{m0}$ in a range that the top electrode 5 exists, while the propagation mode corresponds to a frequency lower than the cut-off frequency $f_{f0}$ in a range that the top electrode 5 is absent. Therefor, a favorable energy trapping cannot be performed, resulting in enlarged loss. The variations of the characteristics of the filter may be enlarged under the influence of the ambience of the top electrode 5.

As a method to prevent such a drawback, a method as described in JP-B 58/58828 (hereinafter, referred to as reference 4) has been used. That is, an addition is added to lead titanate-zirconate, so that the Poisson's ratio of the lead titanate-zirconate mixed with the addition can be one-third or more. Instead of the characteristics like the first mode (TE1) of the thickness extension vibration in FIG. 4, it is set to show up the following characteristics: the frequency is higher as the thickness of the normalized piezoelectric substance is larger in the vicinity of the vertical axis, thereby performing the same energy trapping as a case where the piezoelectric film 4 composed of lead oxide are applied. Note that when the Poisson's ratio exceeds one-third, the cut-off frequency of the first mode (TE1) of the thickness extension vibration is higher than that of the second mode (TS2) of the thickness shear vibration.

This type of the conventional film bulk acoustic wave device which enables to perform the energy trapping is limited by a piezoelectric film composed of a material such as zinc oxide which generates the thickness shear vibration as a main vibration. For this reason, there is a drawback such that it is difficult to flexibly correspond to a variety of characteristics necessary for a filter.

In the piezoelectric film composed of a material such as lead titanate-zirconate, having the thickness extension vibration as a main vibration, since it is difficult to perform the energy-trapping as it stands, the energy-trapping has been performed by bringing the Poisson's ratio to one-third or more with mixing an addition to the material. But, the method described in the reference 4 can be performed only by a fabrication method which sinters piezoelectric ceramics. When the method is applied to a piezoelectric film, it is difficult to maintain favorably the quality of the piezoelectric film, resulting in deteriorating the characteristics of film bulk acoustic wave devices.

SUMMARY OF THE INVENTION

The present invention has been made to solve the aforementioned drawbacks, and an object of this invention is to obtain a film bulk acoustic wave device which enables an energy trapping with a piezoelectric film for exciting or generating a thickness extension vibration as a main vibration, thereby providing a more favorable characteristic than the prior art.

A film bulk acoustic wave device according to the present invention comprises: a substrate; a dielectric film including a silicon nitride (SiN) formed on the substrate and a silicon oxide ($SiO_2$) on the silicon nitride; a bottom electrode formed on the dielectric film; a piezoelectric film formed on the bottom electrode; and a top electrode formed on the piezoelectric film, wherein a via hole is formed in such a manner that the thickness direction of a part of the substrate which is opposite to a region including a part where the top electrode exists is removed from the bottom surface of the substrate to a boundary surface with the silicon nitride.

Thus, the breakdown of the components upon the etching to form a via hole may be prevented through the silicon nitride, and simultaneously, the inferiority of the characteristics of the components due to the deformation caused by the inner stress upon forming the via hole may be prevented.

In the film bulk acoustic wave device according to this invention, the silicon oxide is formed separately on the silicon nitride and on the top electrode.

Thus, the errors on fabrication may be adjusted by the silicon oxide formed on the top electrode, and simultaneously, the top electrode may be protected.

In the film bulk acoustic wave device according to this invention, the piezoelectric film generates a thickness extension vibration as a main vibration, and in order to prevent the thickness of the silicon nitride from affecting the vibration characteristics, the thickness of the silicon oxide is larger than that of the silicon nitride, and 1.5 times or more the thickness of the piezoelectric film.

Thus, an energy trapping possible film bulk acoustic wave device may be performed, which has an effective electromechanical coupling coefficient $k^2$ larger than this type of the conventional film bulk acoustic wave device and has the characteristics of wider range and reduced loss, thereby preventing unnecessary spurious occurrences caused by the end shape of the piezoelectric substance originally irrelevant to the characteristics of the film bulk acoustic wave device, a positional relationship between the end of the piezoelectric substance and the end of the via hole, and so on, and further preventing enlarged loss when the energy of an acoustic wave propagates to the outside of the top electrode.

A film bulk acoustic wave device according to this invention comprises: a dielectric film; a bottom electrode including a conductor having a density of 10000 ($kg/m^3$) or more; a piezoelectric film which generates a thickness extension vibration as a main vibration; and a top electrode including a conductor having a density of 10000 ($kg/m^3$) or more, wherein when the thickness of the piezoelectric film is set to 2 h, the thickness of the dielectric film is set to g, the density of the top electrode is set to $\rho1 \times 1000$ ($kg/m^3$), the thickness of the top electrode is set to d1, the density of the bottom electrode is set to $\rho2 \times 1000$ ($kg/m^3$), the thickness of the bottom electrode is set to d2, and an equivalent density R is set to $R=(\rho1 d1/h)+(\rho2 d2/h)$, the normalized thickness (g/h) of the dielectric film determined by the thicknesses of the piezoelectric film and the dielectric film is $\{0.15 \times R+2.8\}$ or more.

Thus, the film bulk acoustic wave device may perform an energy trapping by use of the second mode (TE2) of the thickness extension vibration, and further has a larger electromechanical coupling coefficient than this type of the conventional film bulk acoustic wave device and little occurs a thickness shear vibration other than the thickness extension vibration as a main vibration, thereby achieving the characteristics of a wider range and a lower loss than the prior art.

A film bulk acoustic wave device according to this invention comprises: a dielectric film; a bottom electrode including a conductor having a density of 10000 (kg/m$^3$) or more; a piezoelectric film which generates a thickness extension vibration as a main vibration; and a bottom electrode including a conductor having a density of 10000 (kg/m$^3$) or less, wherein when the thickness of the piezoelectric film is set to 2 h, the thickness of the dielectric film is set to g, the density of the top electrode is set to ρ1×1000 (kg/m$^3$), the thickness of the top electrode is set to d1, the density of the bottom electrode is set to ρ2×1000 (kg/m$^3$), the thickness of the bottom electrode is set to d2, and an equivalent density R is set to R=(ρ1d1/h)+(ρ2d2/h), the normalized thickness (g/h) of the dielectric film determined by the thicknesses of the piezoelectric film and the dielectric film is {0.023×R+3.5} or more.

Thus, the film bulk acoustic wave device may perform an energy trapping by use of the second mode (TE2) of the thickness extension vibration, and further has a larger electromechanical coupling coefficient than this type of the conventional film bulk acoustic wave device and little occurs a thickness shear vibration other than the thickness extension vibration as a main vibration, thereby achieving the characteristics of a wider range and a lower loss than the prior art.

In the film bulk acoustic wave device according to this invention, the dielectric film has a silicon nitride (SiN) formed on the substrate, and a via hole is formed in such a manner that the thickness direction of a part of the substrate which is opposite to a region including a part where the top electrode exists is removed from the bottom surface of the substrate to a boundary surface with the silicon nitride.

Thus, the breakdown of the components upon the etching to form a via hole may be prevented through the silicon nitride, and simultaneously, the inferiority of the characteristics of the components due to the deformation caused by the inner stress upon forming the via hole may be prevented.

In the film bulk acoustic wave device according to this invention, the silicon oxide is formed separately on the substrate and on the top electrode.

Thus, the error of the thickness upon fabrication may be adjusted and simultaneously, the top electrode may be protected.

In the film bulk acoustic wave device according to this invention, the bottom electrode is mainly composed of either platinum (Pt) or iridium (Ir).

Thus, a favorable piezoelectric film may be obtained.

In the film bulk acoustic wave device according to this invention, the piezoelectric film has as a main component either one of lead titanate (PbTiO$_3$), lead titanate-zirconate (PZT), lithium tantalate (LiTaO$_3$), and a material having the Poisson's ratio less than 0.33.

Thus, a flexible countermeasure may be performed in accordance with the characteristics required for the film bulk acoustic wave device.

DETAILED DESCRIPTION OF THE PREFERRED EMBODIMENT

In order to describe the invention in greater detail, the preferred embodiments of the invention will be described below with reference to the accompanying figures.

Embodiment 1

Figure 1:
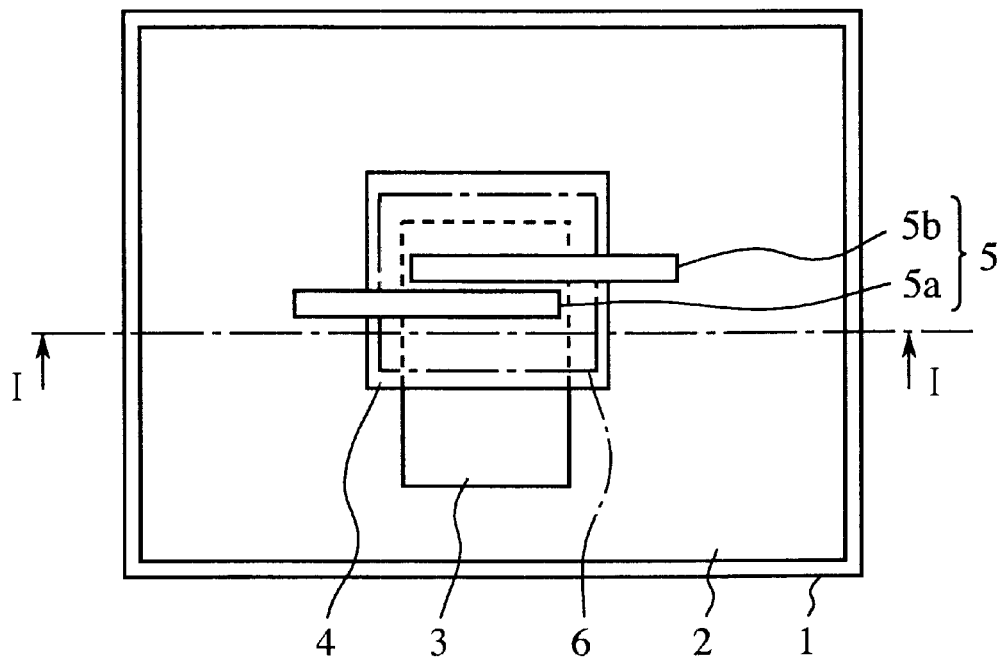
FIG. 1 is a top view showing a conventional film bulk acoustic wave device having a piezoelectric film composed of zinc oxide.
Figure 2:
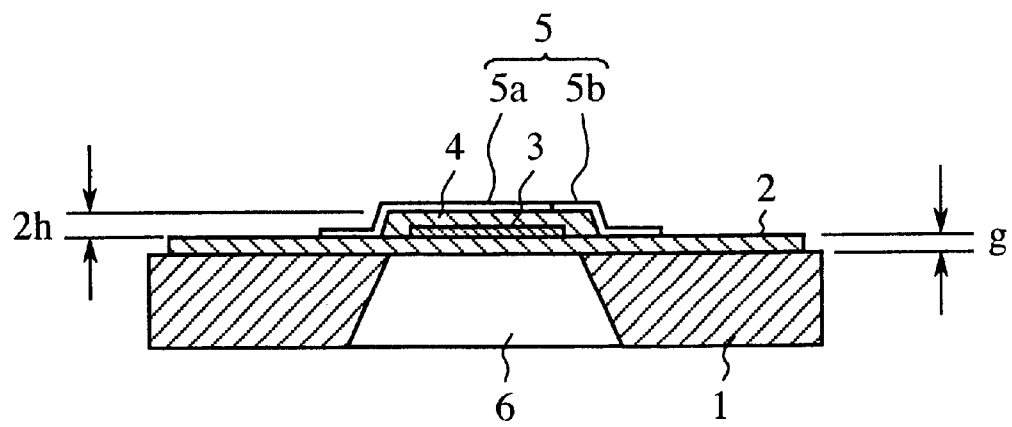
FIG. 2 is a cross sectional view showing the conventional film bulk acoustic wave device having a piezoelectric film composed of zinc oxide.
Figure 5:
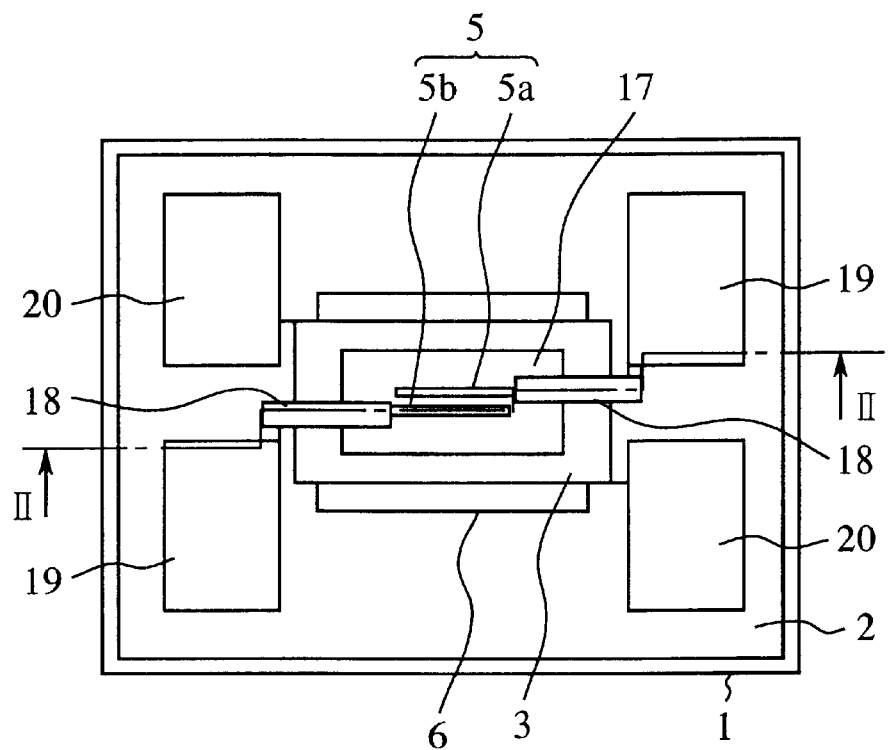
FIG. 5 is a top view showing a film bulk acoustic wave device according to Embodiment 1 of the present invention.
Figure 6:
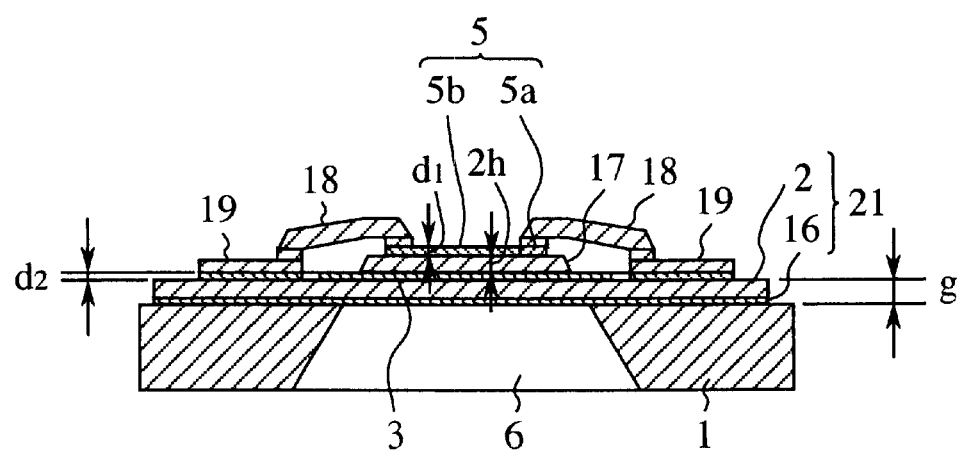
FIG. 6 is a cross sectional view showing the film bulk acoustic wave device according to Embodiment 1 of this invention.

FIGS. 5 and 6 show a film bulk acoustic wave device 4 according to an embodiment 1 of the present invention. FIG. 5 is a top view; and FIG. 6 is a cross sectional view taken along line II—II. In the figures, reference numeral 1 denotes a silicon (Si) substrate; 21 denotes a dielectric film formed on the silicon substrate 1, and composed of a silicon nitride (SiN) 16 formed on the silicon substrate 1 and a silicon oxide ($SiO_2$) 2 formed thereon, in this embodiment. 3 denotes a bottom electrode formed on the dielectric film 21, and composed of a titanium (Ti) film formed on the silicon oxide 2 and a platinum (Pt) film formed thereon, in this embodiment. 17 denotes a piezoelectric film composed of lead titanate ($PbTiO_3$). 5 denotes a top electrode formed on the piezoelectric film 17, having the same structure as the bottom electrode 3 in this embodiment. 18 denotes an air bridge and connects the top electrode 5 to a bonding pad 19. 20 denotes a bonding pad which connects the bottom electrode 3. Note that the same reference numerals or symbols will be denoted by the same components as those of FIGS. 1 and 2. A via hole 6 is formed by removing the bottom surface of the silicon substrate 1 to the boundary surface of the silicon nitride 16 in the thickness direction of a part of the silicon substrate 1 opposite to a region including a part provided with the top electrode 5.

The silicon nitride 16 is particularly favorable in the resistance to an etching solution so as to form the via hole 6 and in the characteristics to an inner stress for achievement of a flat surface, and is particularly suitable for formation of the surface in contact with the via hole 6. Hence, the application of the silicon nitride 16 may prevent the breakdown of elements during etching and also prevent the deterioration of the characteristics of the elements due to the deformation caused by the inner stress.

The titanium film of the bottom electrode 3 is inserted for improvement of an adhesion between the platinum film formed thereon and the dielectric film 21. In addition, the crystallinity of the platinum film of the bottom electrode 3 is very important so as to obtain a favorable piezoelectric film 17 since the piezoelectric film 17 grows along the crystal lattice of the platinum film. Note that the platinum film of the top electrode 5 is used because of its relatively excellent characteristics with respect to corrosion-resistance and electrical resistance. For these purposes, since the platinum and titanium films are applied to the top electrode 5 and bottom electrode 3, the thickness of the platinum film is relatively thicker than that of the titanium film. For example, it is designated by a relationship of the platinum film: 0.1 $\mu$m thick and the titanium film: 0.03 $\mu$m thick.

In the following description, the thickness of the piezoelectric film 17 is set to 2 h; the thickness of the top electrode 5 is set to d1; the thickness of the bottom electrode 3 is set to d2; and the thickness of the dielectric film 21 is set to g. However, the platinum film is thicker than the titanium film, and further the density of platinum is 21370 kg/m³, while the density of titanium is 4540 kg/m³. Thus, since the platinum film affects more largely than the titanium film with respect to the mass load, the thickness of the platinum film is used as a central value when the thickness of the top electrode 5 is d1 and the thickness of the bottom electrode 3 is d2. On the other hand, since there is no critical difference between the silicon nitride 16 and the silicon oxide 2, the sum in thickness of the silicon nitride 16 and the silicon oxide 2 is used when the thickness of the dielectric film 21 is g.

Figure 7:
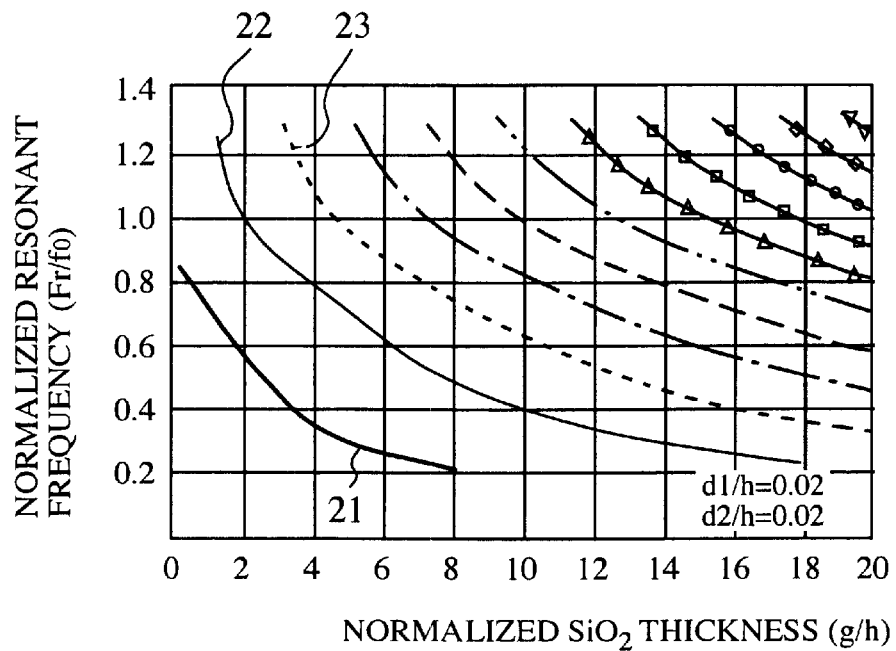
FIG. 7 is a graph showing the normalized resonant frequency characteristics (d1/h=0.02, d2/h=0.02) of the film bulk acoustic wave device according to Embodiment 1 of this invention.
Figure 8:
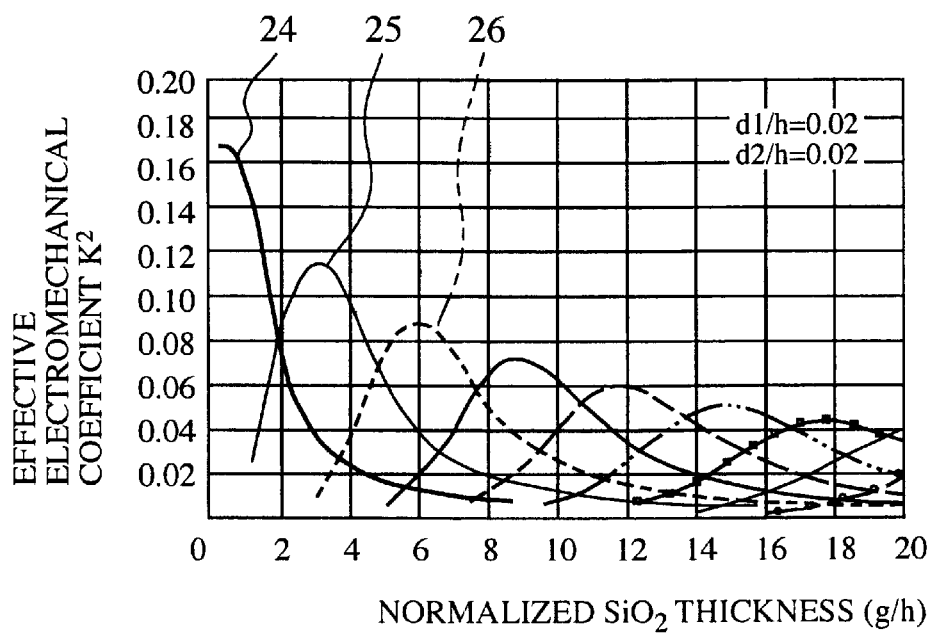
FIG. 8 is a graph showing the electromechanical coupling coefficient characteristics (d1/h=0.02, d2/h=0.02) according to Embodiment 1 of this invention.

FIGS. 7 and 8 are graphs showing the characteristics of the film bulk acoustic wave device according to Embodiment 1. These show the characteristics when the top electrode 5 and bottom electrode 3 are composed of platinum, the piezoelectric film 17 is composed of lead titanate, and the dielectric film 21 is composed of silicon oxide. FIGS. 7 and 8 show the calculation results in a case where both the normalized thickness d1/h of the top electrode 5 determined by the thickness 2 h of the piezoelectric film 17 and the thickness d1 of the top electrode 5, and the normalized thickness d2/h of the bottom electrode 3 determined by the thickness 2 h of the piezoelectric film 17 and the thickness d2 of the bottom electrode 3 is 0.02.

The horizontal axes in FIGS. 7 and 8 are the normalized thickness of the dielectric film 21, that is, normalized $SiO_2$ thickness (g/h), determined by the thickness 2 h of the piezoelectric film 17 and the thickness g of the piezoelectric film 21, that is, normalized $SiO_2$ thickness (g/h). The vertical axis in FIG. 7 is the normalized resonant frequency $Fr/f_0$ when the resonant frequency Fr of the electrode unit is normalized by the resonant frequency $f_0$ in thickness resonance when both surfaces of the electrode unit are free surfaces. The vertical axis in FIG. 8 is the effective electromechanical coefficient $k^2$ determined by $k^2=(Fa^2-Fr^2)/Fr^2$ based on the resonant frequency Fr and the antiresonant frequency Fa.

Figure 3:
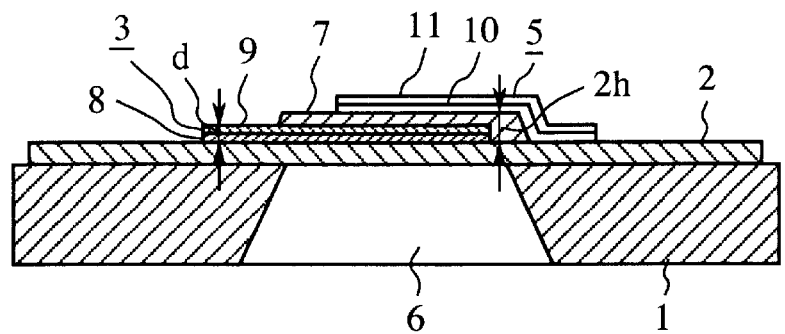
FIG. 3 is a cross sectional view showing a conventional film bulk acoustic wave device having a piezoelectric film composed of PZT.

An equivalent circuit by use of distribution constant lines is used in the calculations. This equivalent circuit is the same as that of an equivalent circuit, for example, as shown of FIG. 3 in JP-A 9-130200 (hereinafter, referred to as reference 5). By applying the material constants such as acoustic constant, dielectric constant, and piezoelectric constant or the thickness of each film to circuit components to the circuit components such as the distribution constant lines corresponding to the top electrode 5, piezoelectric film 17, bottom electrode 3, and dielectric film 21 in the equivalent circuit, the impedance estimated from the electrical terminals of the equivalent circuit is calculated with varying frequencies; a frequency in which the impedance is closest to zero is set to the resonant frequency Fr, while a frequency in which an admittance as a reverse number of the impedance is closest to zero is set to the antiresonant frequency Fa.

In the figures, reference numeral 21 and 24 each denote the characteristics of a first mode (TE1) of the thickness extension vibration; 22 and 25 each denote the characteristics of a second mode (TE2) of the thickness extension vibration; and 23 and 26 each denote the characteristics of a third mode (TE3) thereof.

As is apparent from FIG. 7, the normalized resonant frequency of the first mode (TE1) is a slightly smaller value than 0.4 when the normalized $SiO_2$ thickness is zero; the thicker the normalized $SiO_2$ thickness, the smaller the resonant frequency Fr. Similarly, the thicker the normalized $SiO_2$ thickness, the smaller the resonant frequencies of the second mode (TE2) and third mode (TE3). On the other hand, as is apparent from FIG. 8, the electromechanical coupling coefficient $k^2$ of the first mode (TE1) is substantially maximum when the normalized $SiO_2$ thickness is approximate to zero, while the larger the normalized $SiO_2$ thickness, the smaller the coefficient $k^2$. The electromechanical coupling coefficient $k^2$ of the second mode (TE2) is maximum around the normalized $SiO_2$ thickness of 3, while the electromechanical coupling coefficient $k^2$ of the third mode (TE3) is maximum around the normalized $SiO_2$ thickness of 6.

Figure 9:
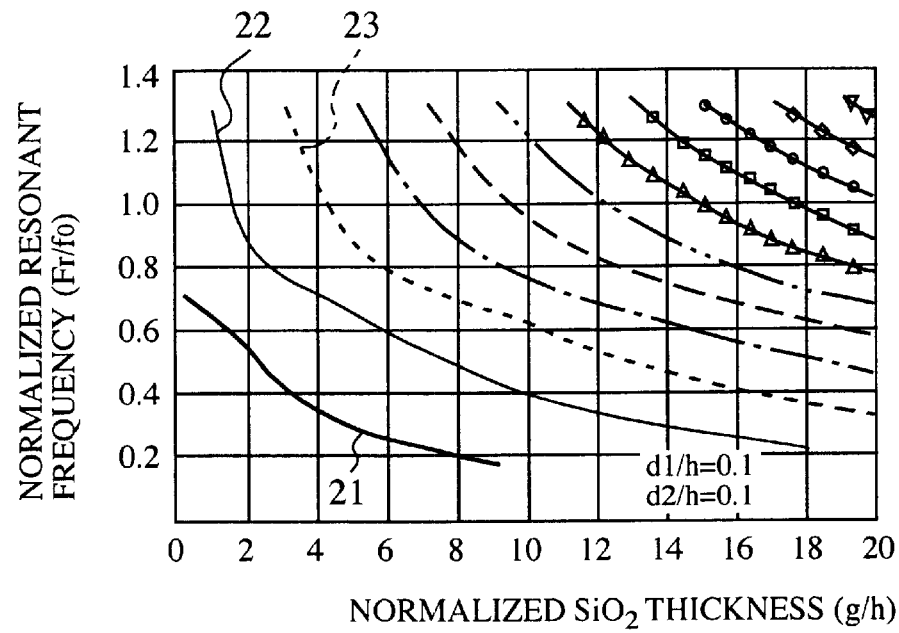
FIG. 9 is a graph showing the normalized resonant frequency characteristics (d1/h=0.1, d2/h=0.1) of the film bulk acoustic wave device according to Embodiment 1 of this invention.
Figure 10:
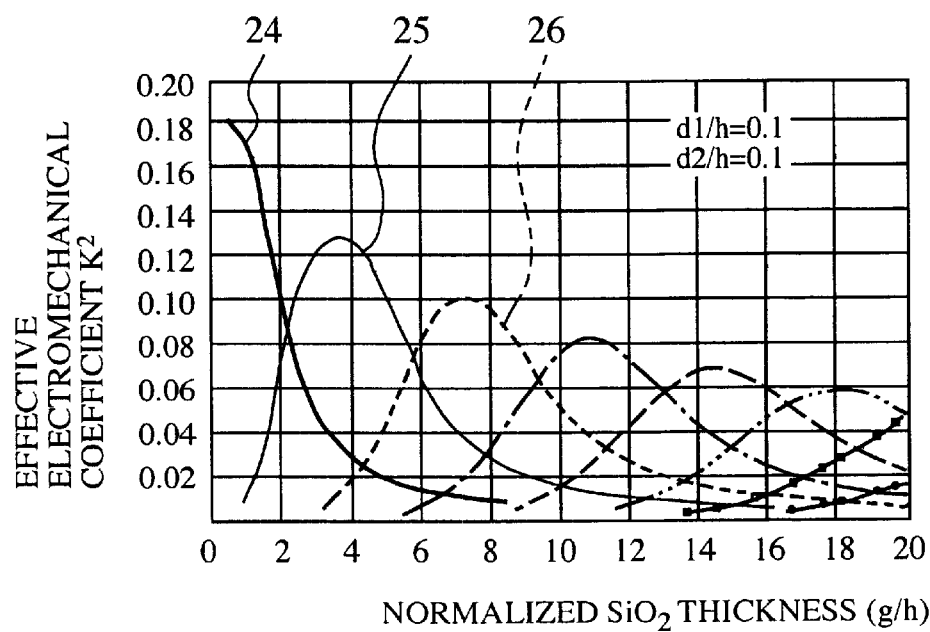
FIG. 10 is a graph showing the electromechanical coupling coefficient characteristics (d1/h=0.1, d2/h=0.1) of the film bulk acoustic wave device according to Embodiment 1 of this invention.

FIGS. 9 and 10 show calculation results, as similarly to FIGS. 7 and 8, when both the normalized thickness (d1/h) of the top electrode 5 and the normalized thickness (d2/h) of the bottom electrode 3 are 0.1. In the cases of FIGS. 9 and 10, the top electrode 5 and bottom electrode 3 are relatively thicker as compared to those of FIGS. 7 and 8; therefor, comparing FIG. 7 with FIG. 9, the resonant frequency Fr of FIG. 9 is lower than that of FIG. 7 with respect to the same normalized $SiO_2$ thickness; and comparing FIG. 8 and FIG. 10, the normalized $SiO_2$ thickness of FIG. 10, such that the electromechanical coefficients $k^2$ of the second mode (TE2) and third mode (TE3) in FIG. 10 each are maximum, is larger than that of FIG. 8.

Figure 4:
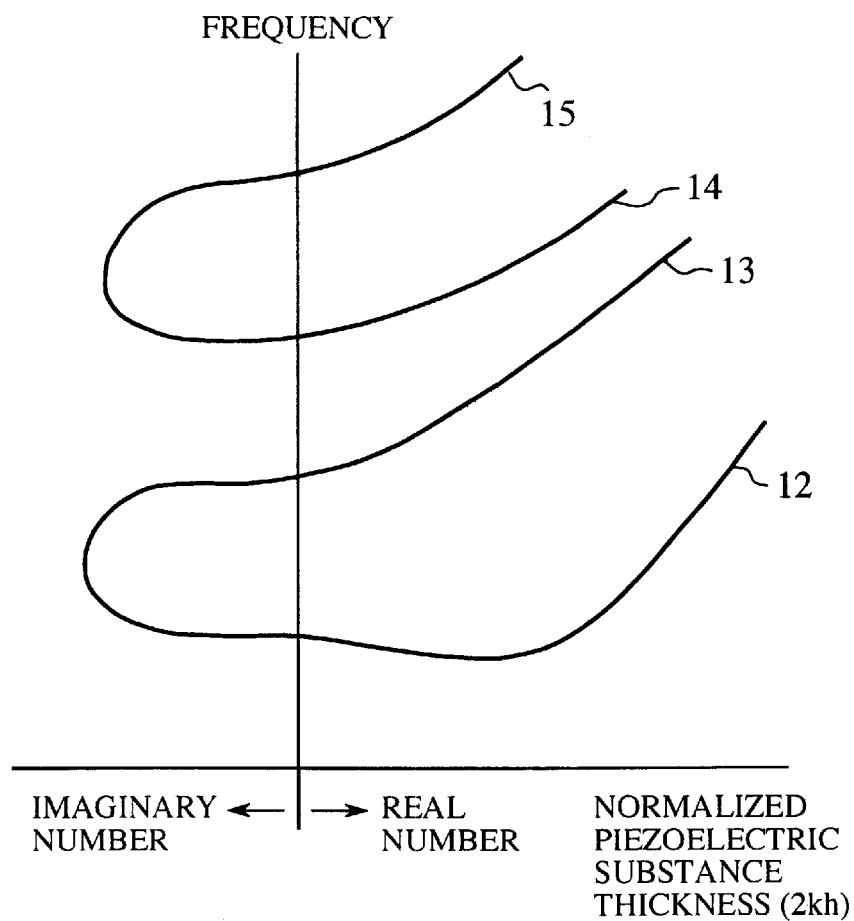
FIG. 4 is a graph showing dispersion characteristics of the conventional film bulk acoustic wave device having a piezoelectric film composed of PZT.

As is apparent from the calculation results as shown in FIGS. 7 to 10, the thickness g of the dielectric film 21 is not only simply affected by the resonant frequency Fr, but also largely affected by the electromechanical coefficient $k^2$ which has a large effect on the film bulk acoustic wave device. Further, as is apparent from FIG. 4, even in a case where the first mode (TE1) of the thickness extension vibration exhibits the characteristics of a high range cut-off or backward-wave type such that the frequency is lowered as the normalized piezoelectric film thickness is increased, the second mode (TE2) of the thickness extension vibration exhibits the characteristics of a low range cut-off. Therefor, for example, when the normalized thicknesses of both the top electrode 5 and bottom electrode 3 are 0.1 and the normalized $SiO_2$ thickness is around 4, the electromechanical coefficient $k^2$ is the largest and an energy trapping possible film bulk acoustic wave device may be achieved. Though the electromechanical coupling coefficient $k^2$ of the second mode (TE2) is smaller by about 30% than the maximum value of the first mode (TE1), the value of about 13% of the maximum value, however, may be expected, and is larger as compared to a case of this type of the conventional film bulk acoustic wave device, thereby performing a film bulk acoustic wave device having the characteristics of wider band and lower loss. This is similarly applied even in a case of the third mode (TE3) or more, which the degree of modes to be used may be determined based on the frequency and electromechanical coupling coefficient $k^2$ to be required as a film bulk acoustic device.

Figure 11:
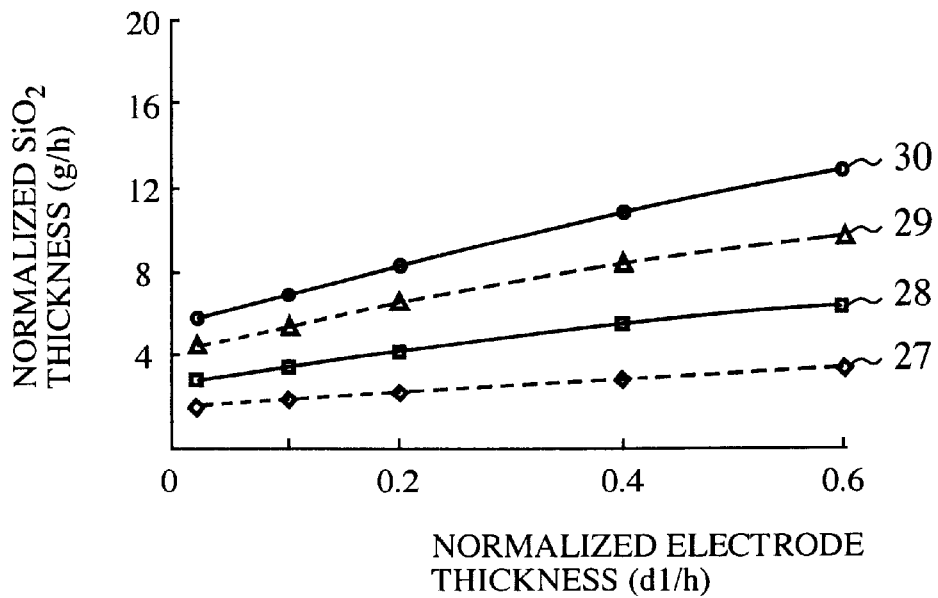
FIG. 11 is a graph showing a relationship between the normalized thickness of the top electrode and the normalized SiO$_2$ thickness when the electromechanical coupling coefficient k$^2$ satisfies a certain condition.

From the calculation results shown in FIGS. 8 and 10, FIG. 11 shows a relationship between the normalized thickness of the top electrode 5 and normalized $SiO_2$ thickness so that the electromechanical coefficient $k^2$ can satisfy a certain condition. The horizontal axis of FIG. 11 represents a normalized thickness of the top electrode 5 or normalized electrode thickness (d1/h), and the vertical axis represents a normalized $SiO_2$ thickness (g/h).

In the figure, reference numeral 27 denotes a normalized $SiO_2$ thickness so that the first mode (TE1) can be equal in the electromechanical coefficient $k^2$ to the second mode (TE2); 28 denotes a normalized $SiO_2$ thickness so that the electromechanical coefficient $k^2$ of the second mode (TE2) can be the largest; 29 denotes a normalized $SiO_2$ thickness so that the second mode (TE2) can be equal in the electromechanical coefficient $k^2$ to the third mode (TE3); and 30 denotes a normalized $SiO_2$ thickness so that the electromechanical coefficient $k^2$ to the third mode (TE3) can be the largest.

As is apparent from FIG. 11, when the normalized $SiO_2$ thickness is 3 or more, or the thickness g of the dielectric film 21 is set to 1.5 times the thickness 2 h of the piezoelectric film 17, it can be brought to more than the normalized $SiO_2$ thickness 28 such that the electromechanical coefficient $k^2$ of the second mode (TE2) is maximum. Therefor, when the thickness g of the dielectric film 21 is set to 1.5 times or more the thickness 2 h of the piezoelectric film 17, the effective electromechanical coefficient $k^2$ is larger than this type of the conventional film bulk acoustic wave device, thereby having the characteristics of wider band and lower loss, and performing an energy trapping possible film bulk acoustic wave device. This may prevent the occurrences of unnecessary spuriousness caused by the end shape of the piezoelectric substance, originally irrelevant to the characteristics of the film bulk acoustic wave device, a positional relationship between the end of the piezoelectric substance and the end of the via hole, and the like, and also prevent an enlarged loss where the energy of the acoustic wave propagates to the outside of the top electrode.

As described above, according to the embodiment 1, for example, when the film bulk acoustic wave device is produced so that the electromechanical coupling coefficient $k^2$ of the second mode (TE2) of the thickness extension vibration is the largest, an energy trapping possible film bulk acoustic wave device with desired favorable characteristics may be achieved.

Embodiment 2

The basic structure of a film bulk acoustic wave device according to an embodiment 2 is the same as that shown in FIGS. 5 and 6.

FIGS. 12 to 15 are graphs showing the characteristics of the film bulk acoustic wave device according to Embodiment 2. In this case, these designate the characteristics in which a top electrode 5 and a bottom electrode 3 are composed of platinum, a piezoelectric film 17 is composed of lead titanate, and a dielectric film 21 is composed of silicon oxide. The horizontal axis of FIGS. 12 to 15 designates a normalized $SiO_2$ thickness (g/h), and the vertical axis thereof designates a normalized cut-off frequency (fc/f$_0$) in which a cut-off frequency fc is normalized by a resonant frequency $f_0$ of thickness resonance when the two sides are free surfaces. The cut-off frequency fc is almost the same as the resonant frequency in which the thickness resonance occurs.

Figure 12:
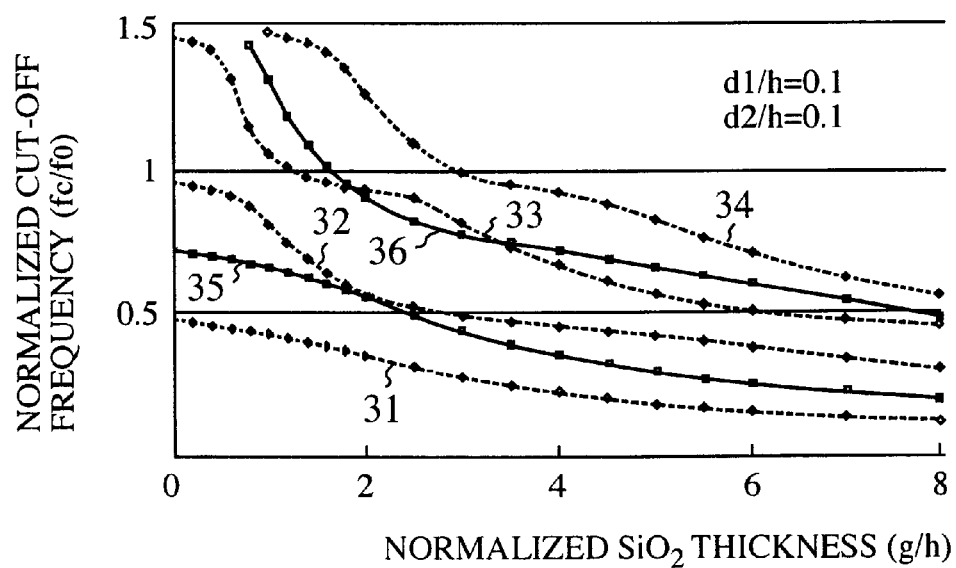
FIG. 12 is a graph showing the normalized cut-off frequency characteristics (d1/h=0.1, d2/h=0.1) of the film bulk acoustic wave device according to Embodiment 2 of this invention.
Figure 13:
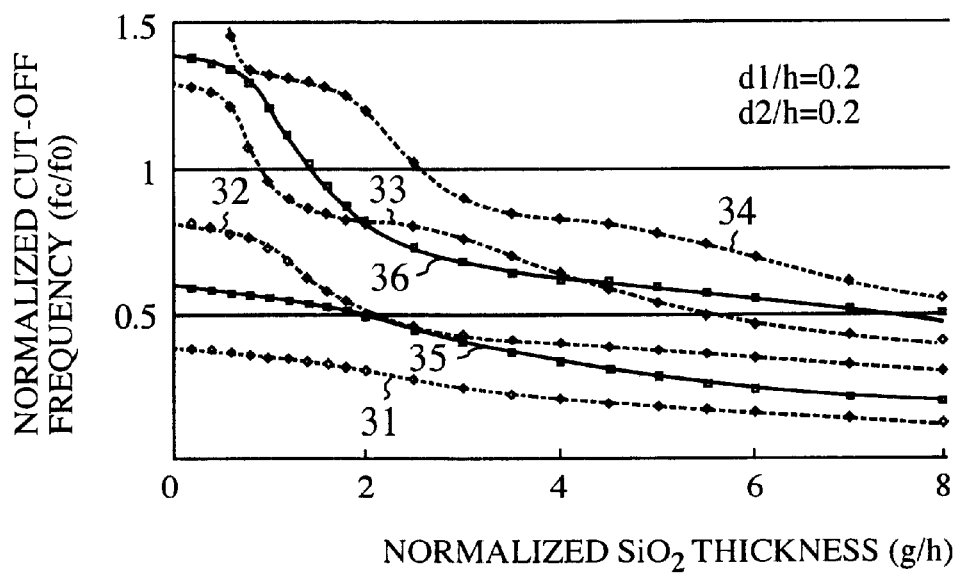
FIG. 13 is a graph showing the cut-off frequency characteristics (d1/h=0.2, d2/h=0.2) of the film bulk acoustic wave device according to Embodiment 2 of this invention.
Figure 14:
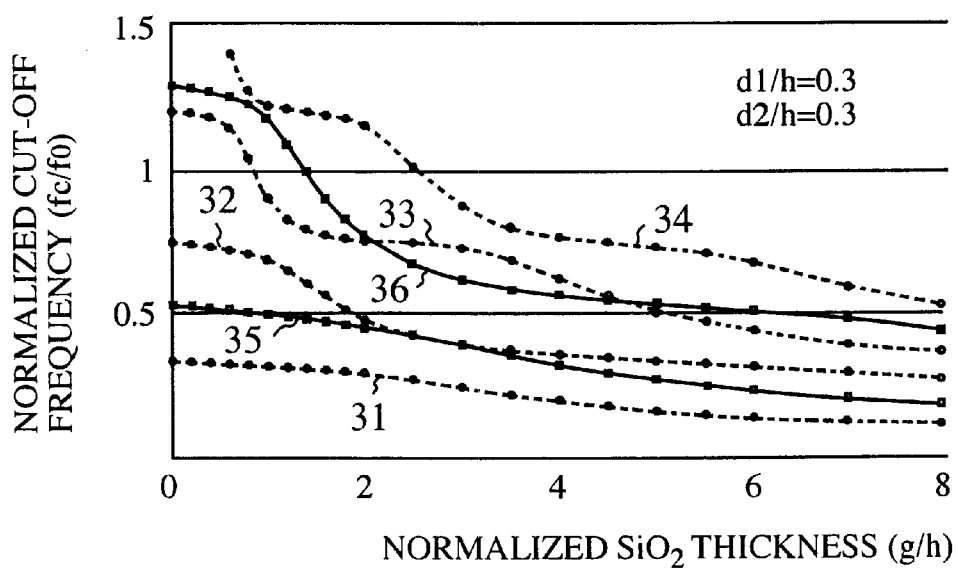
FIG. 14 is a graph showing the normalized cut-off frequency characteristics (d1/h=0.3, d2/h=0.3) of the film bulk acoustic wave device according to Embodiment 2 of this invention.
Figure 15:
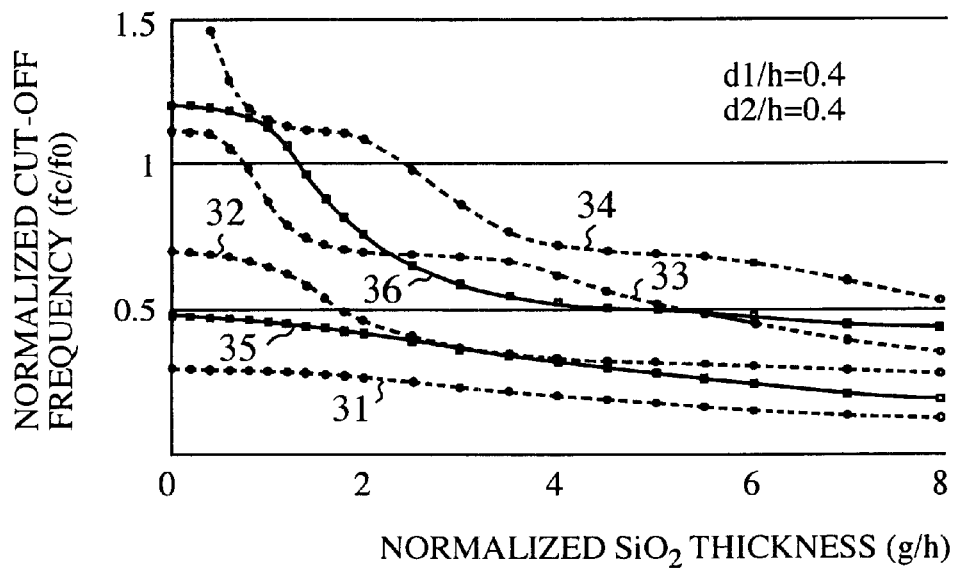
FIG. 15 is a graph showing the normalized cut-off frequency characteristics (d1/h=0.4, d2/h=0.4) of the film bulk acoustic wave device according to Embodiment 2 of this invention.

FIG. 12 is the calculation results in which both the normalized thickness (d1/h) of the top electrode 5 and the normalized thickness (d2/h) of the bottom electrode 3 are 0.1. FIG. 13 is the calculation results in which both the normalized thickness (d1/h) of the top electrode 5 and the normalized thickness (d2/h) of the bottom electrode 3 are 0.2. FIG. 14 is the calculation results in which both the normalized thickness (d1/h) of the top electrode 5 and the normalized thickness (d2/h) of the bottom electrode 3 are 0.3. FIG. 15 is the calculation results in which both the normalized thickness (d1/h) of the top electrode 5 and the normalized thickness (d2/h) of the bottom electrode 3 are 0.4.

In the figures, reference numeral 31 represents the characteristics of the first mode (TS1) of the thickness shear vibration; 32 represents the characteristics of the second mode (TS2) of the thickness shear vibration; 33 represents the characteristics of the third mode (TS3) of the thickness shear vibration; 34 represents the characteristics of the fourth mode (TS4) of the thickness shear vibration; 35 represents the characteristics of the first mode (TE1) of the thickness extension vibration; and 36 represents the characteristics of the second mode (TE2) of the thickness extension vibration.

As is apparent from the calculation results shown in FIGS. 12 to 15, as the normalized $SiO_2$ thickness increases, the normalized cut-off frequencies are respectively decreased for the above-mentioned modes. For example, in FIG. 12, when the normalized $SiO_2$ thickness is 0.1, the normalized cut-off frequency of the TE1 mode is 0.719; however, when the normalized $SiO_2$ thickness is 4.0, the normalized cut-off frequency of the TE1 mode is lowered to 0.348.

On the other hand, the dimensional relationship of the normalized cut-off frequency between the different modes is not regularly the same, it may vary depending on the normalized $SiO_2$ thickness. In particular, the dimensional relationship between the TE2 mode and the TS3 mode is important since it affects largely to the characteristics of the film bulk acoustic wave device.

In FIG. 12, when the normalized $SiO_2$ thickness is about 1.7 or less, the normalized cut-off frequency of the TE2 mode is larger than that of the TS3 mode. However, when the normalized $SiO_2$ thickness is laid between about 1.7 and about 3.4, the normalized cut-off frequency of the TE2 mode is smaller than that of the TS3 mode. When the normalized $SiO_2$ thickness is about 3.4 or more, the normalized cut-off frequency of the TE2 mode is larger than that of the TS3 mode.

Similarly, a range of the normalized $SiO_2$ thickness so that the normalized cut-off frequency of the TE2 mode can be smaller than that of the TS3 mode is about 1.9 to about 4.2 in FIG. 13, about 2.1 to about 4.8 in FIG. 14, and about 2.2 to about 5.3 in FIG. 15.

Figure 16:
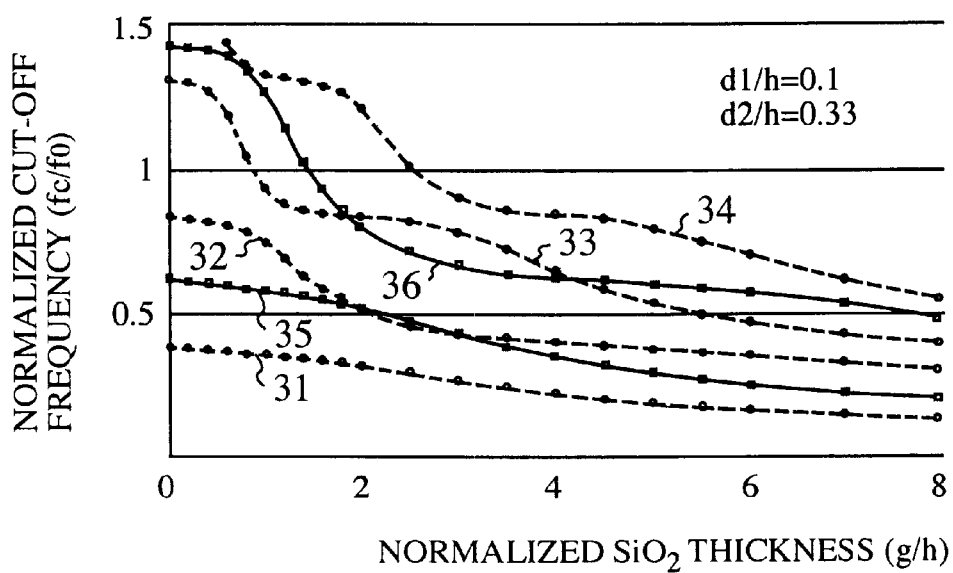
FIG. 16 is a graph showing the normalized cut-off frequency characteristics (d1/h=0.1, d2/h=0.33) of the film bulk acoustic wave device according to Embodiment 2 of this invention.
Figure 17:
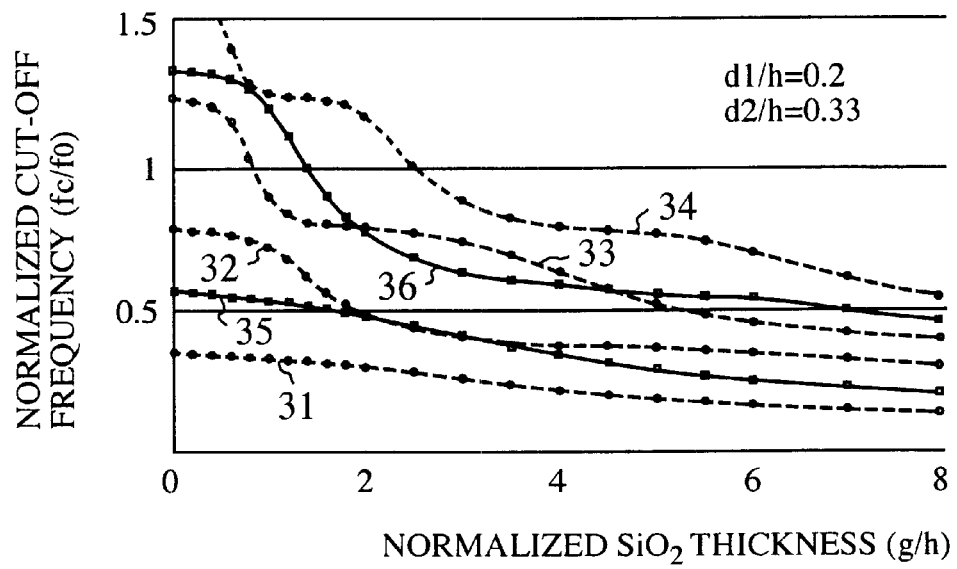
FIG. 17 is a graph showing the normalized cut-off frequency characteristics (d1/h=0.2, d2/h=0.33) of the film bulk acoustic wave device according to Embodiment 2 of this invention.
Figure 18:
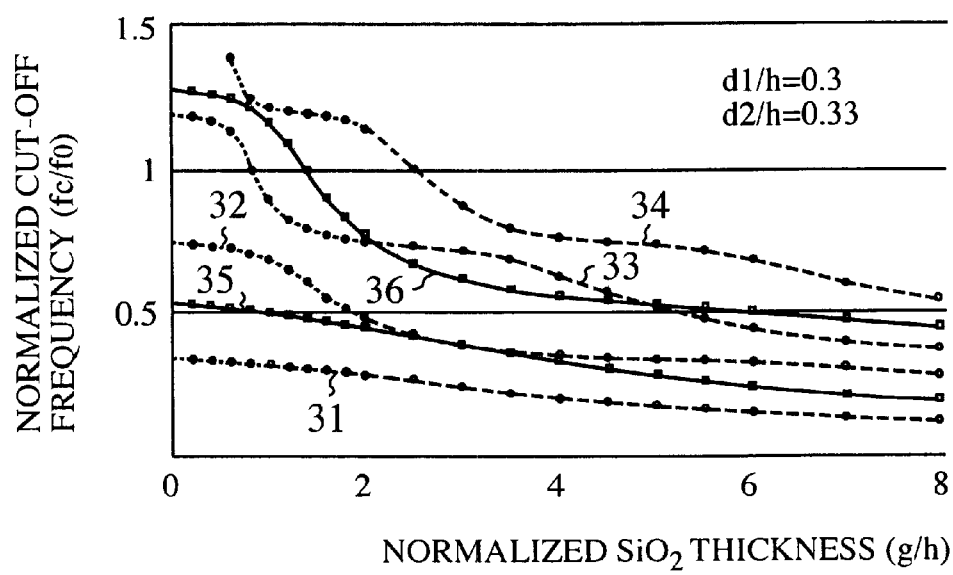
FIG. 18 is a graph showing the normalized cut-off frequency characteristics (d1/h=0.3, d2/h=0.33) of the film bulk acoustic wave device according to Embodiment 2 of this invention.

Then, in a case where the normalized thickness (d1/h) of the top electrode 5 was different from the normalized thickness (d2/h) of the bottom electrode 3, the same calculation as those of FIGS. 12 to 15 were carried out. FIG. 16 shows the calculation results in which the normalized thickness (d1/h) of the top electrode 5 is 0.1 and the normalized thickness (d2/h) of the bottom electrode 3 is 0.33. FIG. 17 shows the calculation results in which the normalized thickness (d1/h) of the top electrode 5 is 0.2 and the normalized thickness (d2/h) of the bottom electrode 3 is 0.33. FIG. 18 shows the calculation results in which the normalized thickness (d1/h) of the top electrode 5 is 0.3 and the normalized thickness (d2/h) of the bottom electrode 3 is 0.33.

In FIGS. 16 to 18 also, when a range of the normalized $SiO_2$ thickness so that the normalized cut-off frequency of the TE2 mode can be smaller than that of the TS3 mode is determined, it is about 1.8 to about 4.2 in FIG. 16, about 2.0 to about 4.5 in FIG. 17, and about 2.1 to about 4.1 in FIG. 18.

Figure 19:
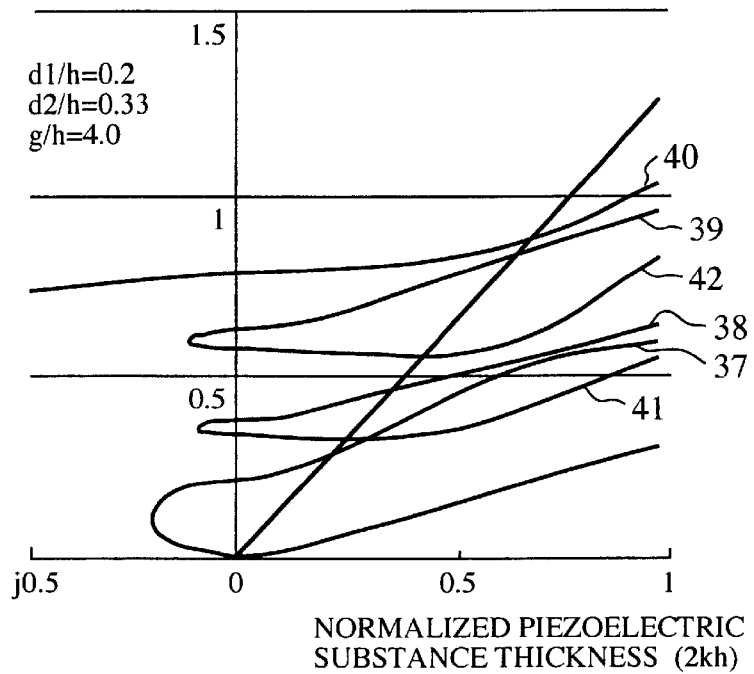
FIG. 19 is a graph showing the dispersion characteristics (g/h=4.0) of the film bulk acoustic wave device according to Embodiment 2 of this invention.

FIG. 19 is a graph showing the dispersion characteristics of the film bulk acoustic wave device according to the embodiment 2. This indicates the dispersion characteristics in which the top electrode 5 and bottom electrode 3 are composed of platinum, the piezoelectric film 17 is composed of lead titanate, and the dielectric film is composed of silicon oxide. The horizontal axis of FIG. 19 represents the normalized piezoelectric substance thickness (2kh) and the vertical axis thereof represents the normalized frequency (f/f$_0$), where $f_0$ is the same as those of FIGS. 12 to 18. The normalized frequency at each mode in an intersection with the vertical axis is the normalized cut-off frequency (fc/f$_0$).

FIG. 19 indicates the calculation results where the normalized thickness (d1/h) of the top electrode 5 is 0.2, the normalized thickness (d2/h) of the bottom electrode 3 is 0.33, and the normalized $SiO_2$ thickness (g/h) is 4.0, corresponding to the calculation results in a region where the normalized cut-off frequency of the TE2 mode in FIG. 17 is smaller than that of the TS3 mode.

In the figure, reference numeral 37 denotes a dispersion characteristic of the TS1 mode, 38 denotes a dispersion characteristic of the TS2 mode, 39 denotes a dispersion characteristic of the TS3 mode, 40 denotes a dispersion characteristic of the TS4, 41 denotes a dispersion characteristic of the TE1, and 42 denotes a dispersion characteristic of the TE2.

As is apparent from FIG. 19, the TE1 and TE2 modes denote backward-wave dispersion characteristics such that as the normalized piezoelectric substance thickness is larger, the normalized frequency is lowered in the vicinity of the vertical axis. This represents that a frequency range higher than the cut-off frequency corresponds to a cut-off mode incapable of propagating acoustic waves. When the above-depicted dispersion characteristics are exhibited, an energy-trapping which traps the energy of acoustic waves are unfavorably carried out, thereby deteriorating the characteristics of the film bulk acoustic wave device. Therefore, when the normalized $SiO_2$ thickness (g/h) is 4.0, a favorable film bulk acoustic wave device cannot be obtained even when either mode of the first mode (TE1) of the thickness extension vibration and the second mode (TE2) of the thickness shear vibration-is applied.

Figure 20:
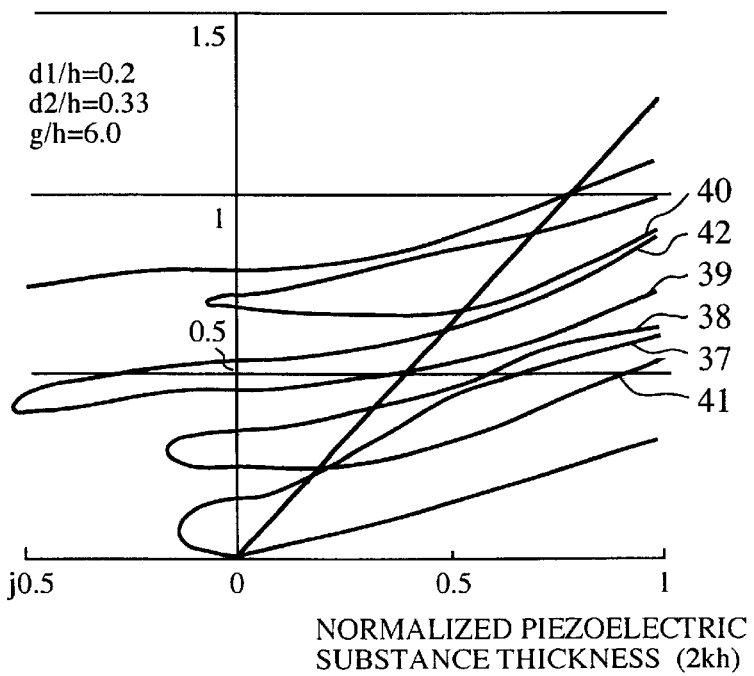
FIG. 20 is a graph showing the dispersion characteristics (g/h=6.0) of the film bulk acoustic wave device according to Embodiment 2 of this invention.

FIG. 20 denotes the calculation results as well as FIG. 19 where the normalized $SiO_2$ thickness (g/h) is 6.0, and the calculation results in a region where the normalized cut-off frequency of the TE2 mode in FIG. 17 is larger than that of the TS3 mode.

As is apparent from FIG. 20, the TE1 mode denotes a backward-wave dispersion characteristic as well as FIG. 19, and the TE2 mode denotes a high-band-cut-off dispersion characteristic. Accordingly, in a case where the normalized $SiO_2$ thickness (g/h) is 6.0, when the second mode (TE2) of the thickness extension vibration is used, the energy of acoustic waves can be trapped, thereby obtaining a favorable film bulk acoustic wave device.

Figure 21:
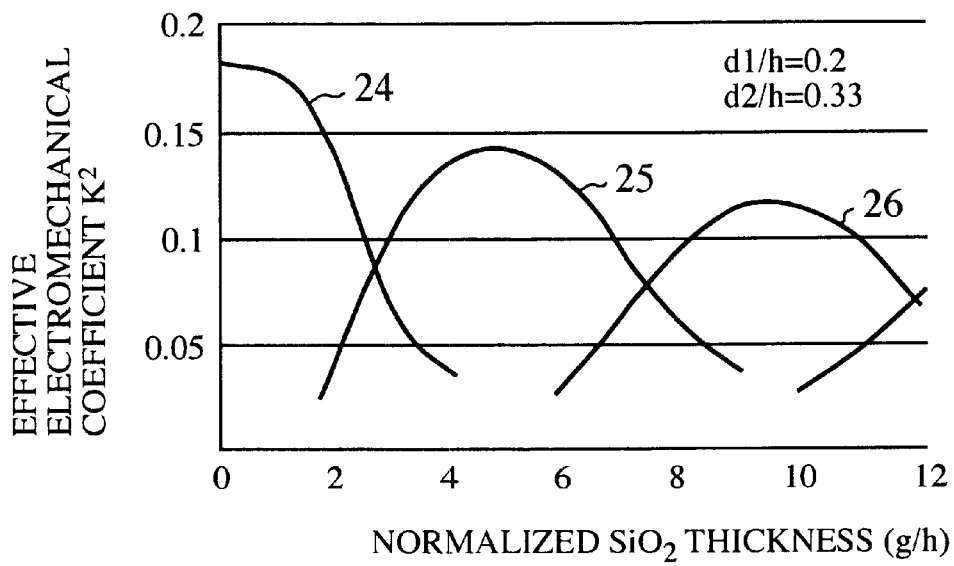
FIG. 21 is a graph showing the electromechanical coupling coefficient characteristics of the film bulk acoustic wave device according to Embodiment 2 of this invention.

FIG. 21 is a graph showing the characteristics of the film bulk acoustic wave device according to the embodiment 2. This indicates the characteristics where the top electrode 5 and bottom electrode 3 are composed of platinum, the piezoelectric film 17 is composed of lead titanate, and the dielectric film 21 is composed of silicon oxide. FIG. 21 is the calculation results where the normalized thickness (d1/h) of the top electrode 5 is 0.2, and the normalized thickness (d2/h) of the bottom electrode 3 is 0.33. These conditions are the same as those of FIG. 17. The horizontal axis of FIG. 17 corresponds to the normalized $SiO_2$ thickness (g/h), while the vertical axis corresponds to the effective electromechanical coupling coefficient $k^2$.

As is apparent from FIG. 21, in a range of the normalized $SiO_2$ thickness of about 3 to about 7, the effective electromechanical coupling coefficient $k^2$ of the TE2 mode is larger than those of the other modes, and is maximum around the normalized $SiO_2$ thickness of 4.5. Conventionally, the film bulk acoustic wave device using the TE2 mode was applied in a range that the effective electromechanical coupling coefficient $k^2$ had a large value. But, on the other hand, as shown in FIG. 17, unless the normalized $SiO_2$ thickness is 4.5 or more, a favorable energy trapping possible film bulk acoustic wave device cannot be performed with the TE2 mode.

Figure 22:
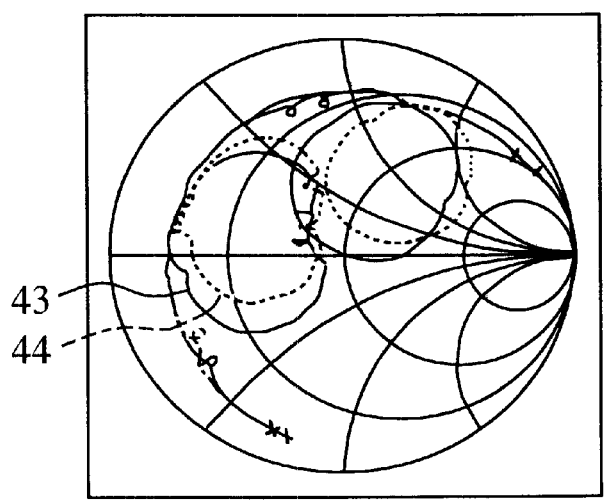
FIG. 22 is a graph showing the impedance characteristics (g/h=4.2) of the film bulk acoustic wave device according to Embodiment 2 of this invention.

FIG. 22 is a graph showing the measurement results of input impedance (S11) and output impedance (S22) of the film bulk acoustic wave device according to the embodiment 2, and represents the measurement results where the top electrode 5 and bottom electrode 3 is composed of platinum film using a titanium film as a contact film, the piezoelectric film 17 is composed of lead titanate, and the dielectric film 21 is composed of silicon oxide formed on a silicon nitride.

The thickness of the titanium film constituting the top electrode 5 is 0.05 μm, and the thickness of the platinum film is 0.15 μm. The thickness of the titanium film constituting the bottom electrode 3 is 0.05 μm, and the thickness of the platinum film is 0.15 μm. The thickness 2h of the piezoelectric film 17 is 0.9 μm. The thickness of the silicon nitride constituting the dielectric film 21 is 0.1 μm, while the thickness of silicon oxide is 1.8 μm. Thus, the normalized thickness (d1/h) of the top electrode 5 and the normalized thickness (d2/h) of the bottom electrode 3 is about 0.33, while the normalized thickness (g/h) of the dielectric film 21 is 4.2. In addition, the dimensions of the input-side electrode 5a and output-side electrode 5b of the top electrode 4 is 14 (μm) by 80 in rectangle, and the input-side electrode 5a is arranged apart from the output-side electrode 5b by 0.7 μm.

In FIG. 22, a solid line 43 denotes the measurement results of the input impedance (S11); a dotted line 44 denotes the measurement results of the output impedance (S22). Considerably large resonant circles exist near 800 MHz and 1.4 GHz.

Figure 23:
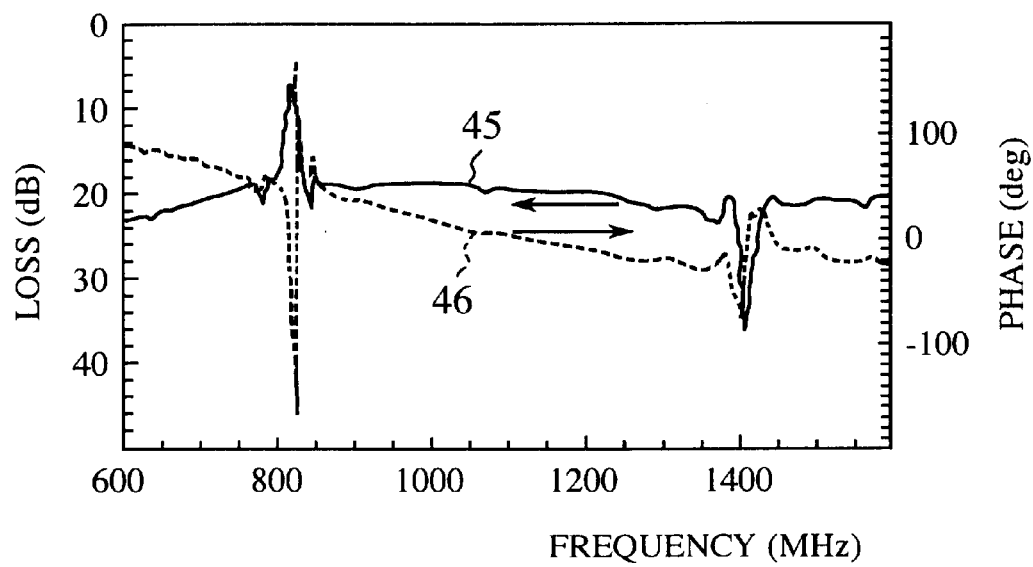
FIG. 23 is a graph showing the passing characteristics (g/h=4.2) of the film bulk acoustic wave device according to Embodiment 2 of this invention.

In FIG. 23, a solid line 45 denotes the measurement results of the loss; a dotted line 46 denotes the measurement results of the phase. As is apparent from FIG. 23, there is a transmission range near 800 MHz, and a small transmission range near 1.4 GHz. At the just higher frequency side, there is a zero point that the loss increases steeply.

In FIGS. 22 and 23, the characteristic around 800 MHz depends on the first mode (TE1) of the thickness extension vibration. The characteristic around 1.4 GHz depends on the second mode (TE2) of the thickness extension vibration. Since the thickness shear vibration little occurs in case of the piezoelectric film 17 composed of lead titanate, there is no appearance in the measurement results. In the first mode (TE1) of the thickness extension vibration, as shown in FIG. 22, a large resonant circle is appeared in the impedance characteristics; as shown in FIG. 23, a transmission range is also present. On the other hand, in the second mode (TE2) of the thickness extension vibration, as shown in FIG. 22, a large resonant circle is appeared in the impedance characteristics; however, as shown in FIG. 23, the transmission range is extremely small.

Figure 24:
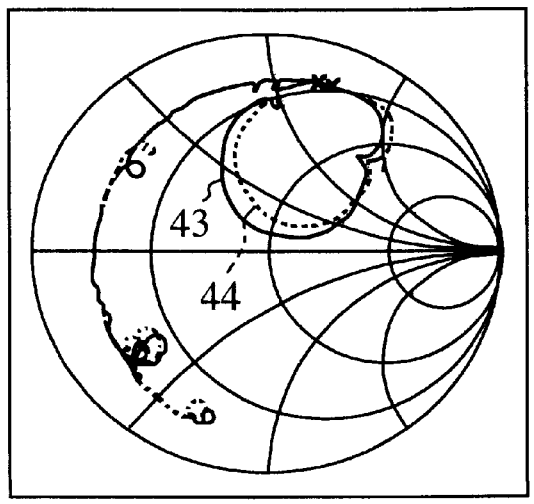
FIG. 24 is a graph showing the impedance characteristics (g/h=4.7) of the film bulk acoustic wave device according to Embodiment 2 of this invention.
Figure 25:
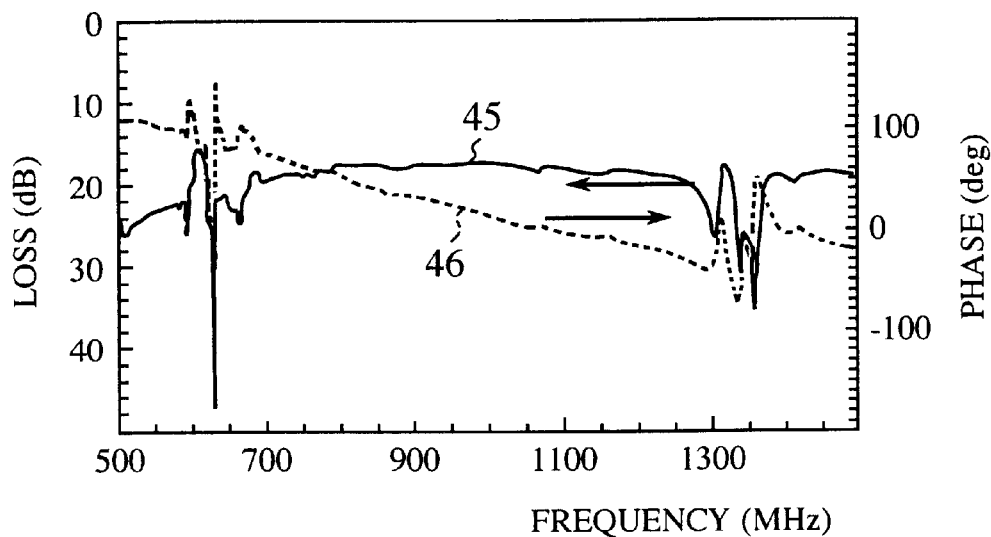
FIG. 25 is a graph showing the passing characteristics (g/h=4.7) of the film bulk acoustic wave device according to Embodiment 2 of this invention.

FIGS. 24 and 25 denote the measurement results when the thickness of the silicon oxide is 2.0 μm, as well as FIGS. 22 and 23. Accordingly, the normalized thickness (d1/h) of the top electrode 5 and the normalized thickness (d2/h) of the bottom electrode 3 are about 0.33, and the normalized thickness (g/h) of the dielectric film 21 is 4.7. In addition, the dimension of the input-side electrode 5a and output-side electrode 5b of the top electrode 5 is 14 (μm) by 70 in rectangle. The input-side electrode 5a is arranged apart from the output-side electrode 5b by 0.5 μm.

Though resonant circles exist around 600 MHz and 1.3 GHz, the resonant circle around 600 MHz is smaller than that around 1.3 GHz.

As is apparent from FIG. 25, there is a transmission range around the frequency 600 MHz, and there is also a transmission range around the frequency 1.3 GHz.

The differences between the measurement results shown in FIGS. 22 and 23 and those shown in FIGS. 24 and 25 are based on the thickness difference of the dielectric film 21. Since the case of FIGS. 22 and 23 is smaller in the thickness of the dielectric film 21 than that of FIGS. 24 and 25. In addition, as is apparent from FIG. 21, the effective electromechanical coefficient $k^2$ of the first mode (TE1) of the thickness extension vibration is larger in the case of FIGS. 22 and 23. Due to this reason, it appears the case of FIG. 22 is larger than that of FIG. 24 in the resonant circle at the lower frequency side.

In contrast, in the resonant circle of the higher frequency side, FIG. 22 is almost the same as FIG. 24, while in the transmission characteristics, FIG. 23 is different from FIG. 25. The normalized electrode thickness used for the measurements of FIGS. 22 to 25 is close to the case of FIG. 13. As is apparent from FIG. 13, in the normalized $SiO_2$ thickness, the case of FIGS. 22 and 23 is 4.2, while the case of FIGS. 24 and 25 is 4.7; the energy-trapping is insufficient in both the cases. But, the case of FIGS. 24 and 25 is closer in the intersection between the TE2 and TS3 modes; the case of FIGS. 22 and 23 is more insufficient in the energy-trapping than that of FIGS. 24 and 25; it appears such a difference provides the difference in the transmission characteristics.

From the calculation results shown in FIGS. 12 to 18, FIG. 26 denotes the normalized $SiO_2$ thickness in which the TE2 mode intersects with the TS3 mode. The horizontal axis of FIG. 26 corresponds to the normalized thickness of the top electrode 5, or normalized electrode thickness (d1/h), while the vertical axis corresponds to the normalized $SiO_2$ thickness (g/h).

In the figure, the solid lines 47 and 48 denote the case in which the top electrode 5 is the same thickness as the bottom electrode 3; the dashed lines 49 and 50 each denote in a case where the normalized thickness (d2/h) of the bottom electrode 3 is 0.33, and different from the thickness (d1/h) of the top electrode 5. In the figure, reference numeral 47 and 49 denote a larger one of the normalized $SiO_2$ thicknesses in which the TE2 mode intersects with the TS3 mode, while 48 and 50 denote a smaller one of the normalized $SiO_2$ thicknesses in which the TE2 mode intersects with the TS3 mode.

Figure 26:
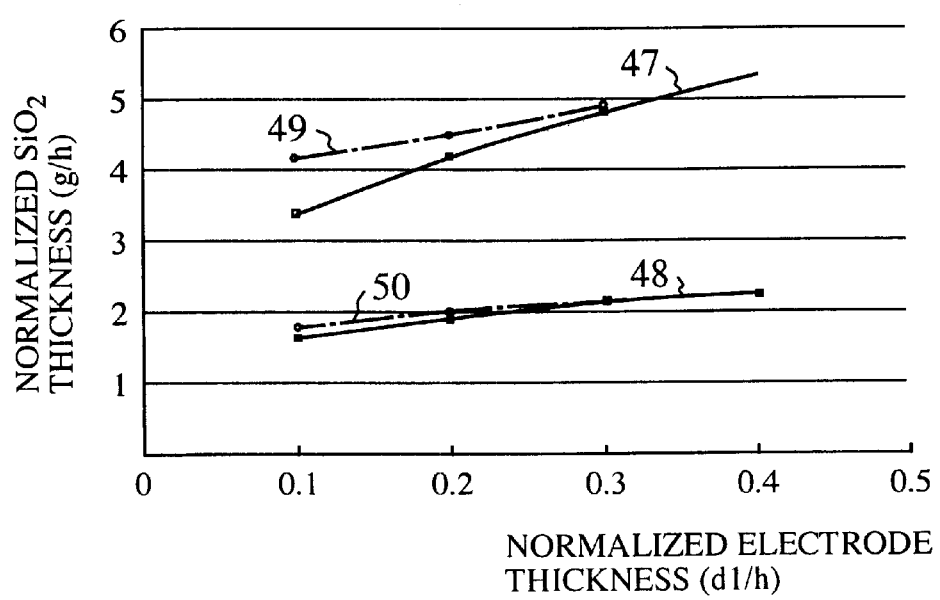
FIG. 26 is a graph showing the normalized $SiO_2$ thickness in which the TE2 mode crosses the TS3 mode of the film bulk acoustic wave device according to Embodiment 2 of this invention when the horizontal axis is designated as the normalized electrode thickness.

As is apparent from FIG. 26, since depicted are different loci between a case where the thickness of the top electrode 5 is different from that of the bottom electrode 3 and a case where the former is equal to the latter, a relationship between the thicknesses of the top electrode 5 and bottom electrode 3 and the thickness of the dielectric film 21 cannot be typically represented.

Since the thickness resonance changes depending on the change of the propagation route of the acoustic wave due to the thicknesses of the top electrode 5 and bottom electrode 3, and the mass loads of the top electrode 5 and bottom electrode 3, an equivalent density R here is defined as the following expression, so as to represent the mass loads of the top electrode 5 and bottom electrode: $R=(\rho 1 d1/h+\rho 2 d2/h)$, where $\rho 1$ is a density of the top electrode 5 ($\times 1000$ kg/m3), $\rho 2$ is a density of the bottom electrode 3 ($\times 1000$ kg/m3). When the top electrode 5 and bottom electrode 3 are composed of a plurality types of metal films, the equivalent density may be determined separately for each metal film. For example, in a case where the top electrode 5 and bottom electrode 3 each are composed of a platinum film and a titanium film, and the titanium film and the platinum film constituting the top electrode 5 and bottom electrode 3 are 0.05 $\mu$m thick, and 0.15 $\mu$m thick, respectively, $R=(4.58\times 0.05/0.45+21.62\times 0.15/0.45)\times 2=15$, where 4.58 is a density of titanium, and 21.62 is a density of platinum.

Figure 27:
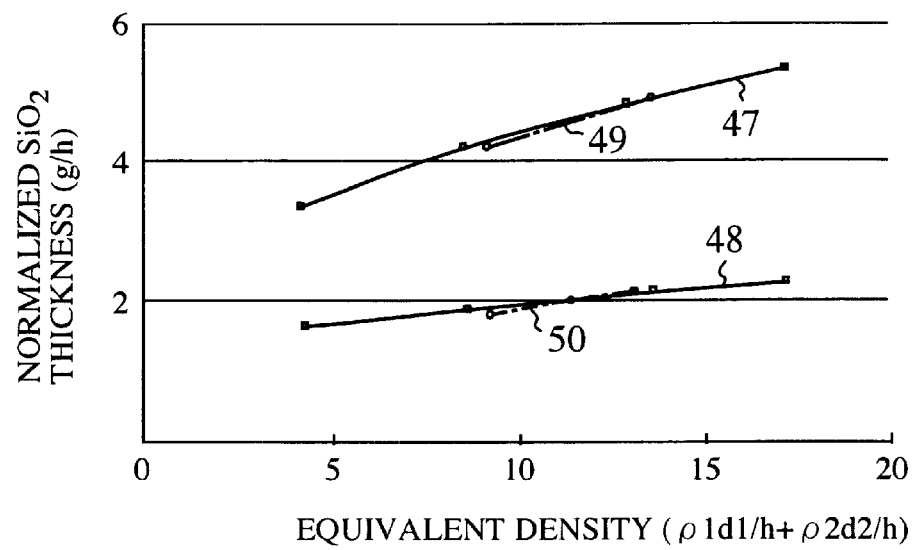
FIG. 27 is a graph showing the normalized $SiO_2$ thickness in which the TE2 mode crosses the TS3 mode of the film bulk acoustic wave device according to Embodiment 2 of this invention when the horizontal axis is designated as the equivalent density.

FIG. 27 corresponds to a graph in which the horizontal axis of the graph shown in FIG. 26 is plotted as the equivalent density R. As is apparent from FIG. 27, a locus where the top electrode 5 and bottom electrode 3 are different in thickness from each other matches a locus where they are equal in thickness to each other. In order to achieve an energy trapping possible film bulk acoustic wave device, it is required that the normalized $SiO_2$ thickness is larger than a locus representing a larger value of the normalized $SiO_2$ thicknesses in which the TE2 mode intersects with the TS3 mode. When an approximate right line is determined from a locus exhibiting a larger value than the normalized $SiO_2$ thickness in which the TE2 mode crosses the TS3 mode in FIG. 27, the following expression is provided: $(g/h)=(0.147\times R+2.85)$. Thus, to show up a larger normalized $SiO_2$ thickness (g/h) than this straight line is a condition to perform an energy trapping possible film bulk acoustic wave device using the second mode (TE2) of the thickness extension vibration, the device having more favorable characteristics than the prior art.

As described above, according to Embodiment 2, when the normalized $SiO_2$ thickness (g/h) is set to a value of $(0.147\times R+2.85)$ or more, an energy trapping possible film bulk acoustic wave device may be achieved by use of the second mode (TE2) of the thickness extension vibration. Further, the film bulk acoustic wave device has a larger electromechanical coefficient than this type of the conventional film bulk acoustic wave device, and little occurs the thickness shear vibration except the thickness extension vibration as a main vibration, thereby providing the characteristics of reduced losses or wider ranges as compared to the prior art.

Embodiment 3

Though the basic structure of a film bulk acoustic wave device of Embodiment 3 is the same as that shown in FIGS. 5 and 6, the top electrode 5 is composed of aluminum (Al) in Embodiment 3. The density of aluminum is 2690 (kg/m$^3$).

Figure 28:
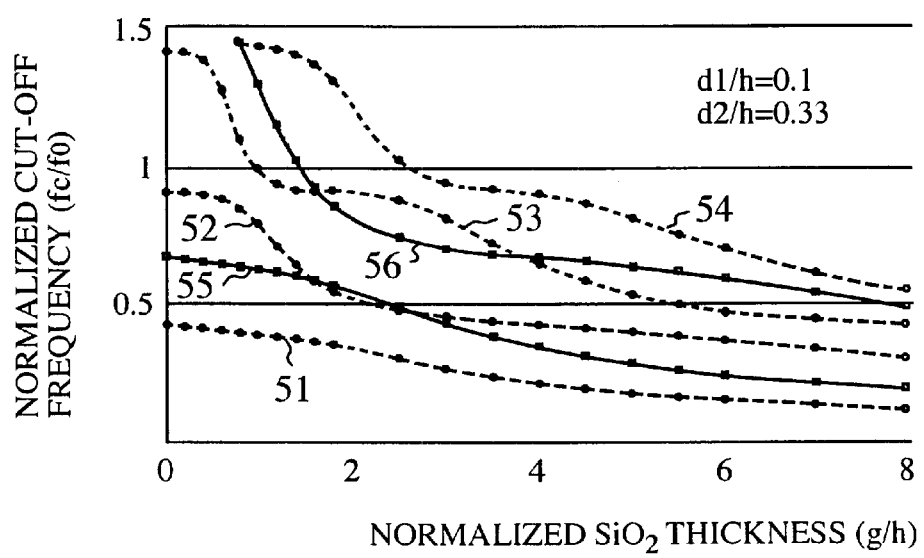
FIG. 28 is a graph showing the normalized cut-off frequency characteristics (d1/h=0.1, d2/h=0.33) of the film bulk acoustic wave device according to Embodiment 3 of this invention.
Figure 29:
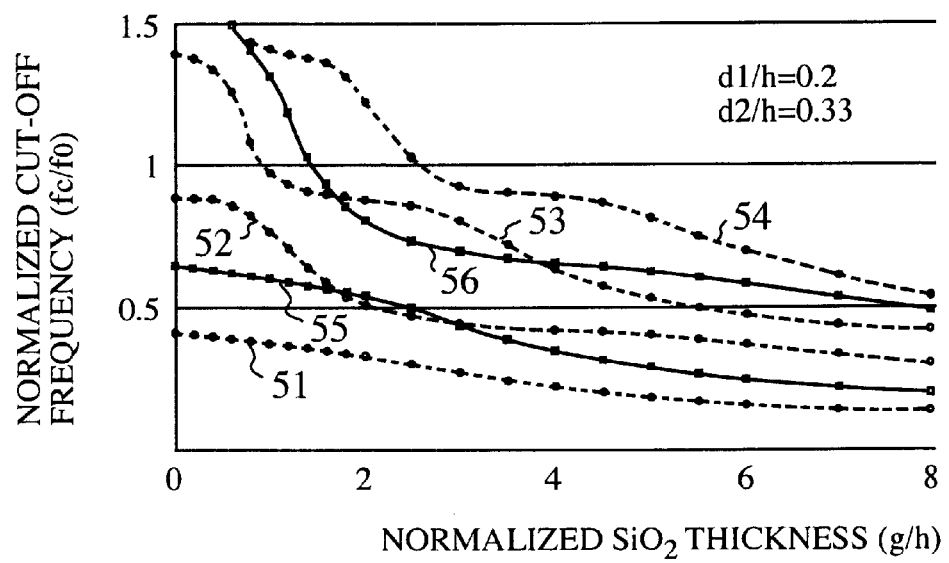
FIG. 29 is a graph showing the normalized cut-off frequency characteristics (d1/h=0.2, d2/h=0.33) of the film bulk acoustic wave device according to Embodiment 3 of this invention.
Figure 30:
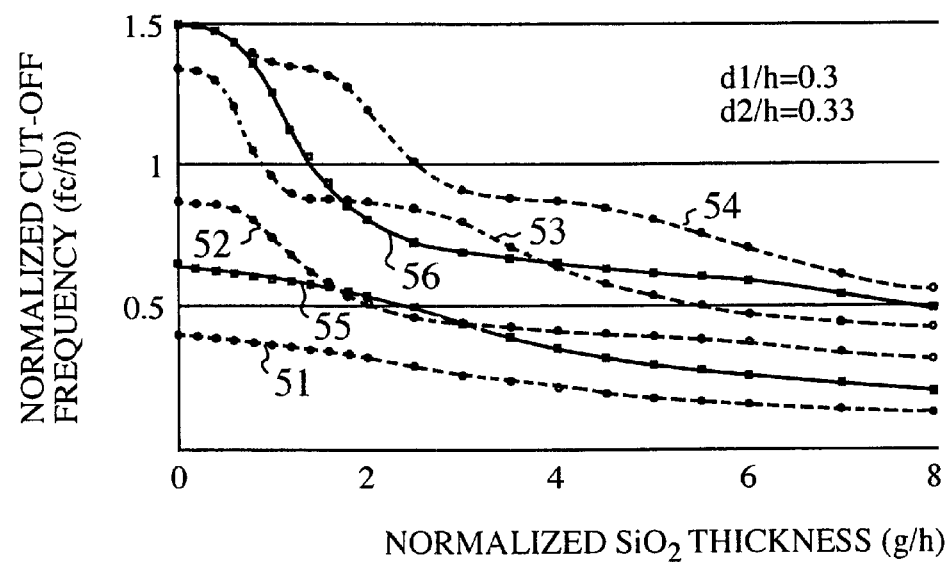
FIG. 30 is a graph showing the normalized cut-off frequency characteristics (d1/h=0.3, d2/h=0.33) of the film bulk acoustic wave device according to Embodiment 3 of this invention.

FIGS. 28 to 30 are graphs showing the characteristics of the film bulk acoustic wave device according to Embodiment 3. These here show the characteristics where the top electrode 5 is composed of aluminum, the bottom electrode 3 is composed of platinum, the piezoelectric film 17 is composed of lead titanate (PbTiO3), and the dielectric film 21 is composed of silicon oxide. The horizontal axis of FIGS. 28 to 30 corresponds to the normalized $SiO_2$ thickness (g/h), and the vertical axis thereof corresponds to the normalized cut-off frequency (fc/f$_0$).

FIG. 28 represents the calculation results in a where the normalized thickness of the top electrode 5 (d1/h) is 0.1, and the normalized thickness (d2/h) of the bottom electrode 3 is 0.33. FIG. 29 represents the calculation results in a where the normalized thickness of the top electrode 5 (d1/h) is 0.2, and the normalized thickness (d2/h) of the bottom electrode 3 is 0.33. FIG. 30 represents the calculation results in a where the normalized thickness of the top electrode 5 (d1/h) is 0.3, and the normalized thickness (d2/h) of the bottom electrode 3 is 0.33.

In the figures, reference numeral 51 denotes the characteristics of the first mode (TS1) of the thickness shear vibration; 52 denotes the characteristics of the second mode (TS2) of the thickness shear vibration; 53 denotes the characteristics of the third mode (TS3) of the thickness shear vibration; 54 denotes the characteristics of the fourth mode (TS4) of the thickness shear vibration; 55 denotes the characteristics of the first mode (TE1) of the thickness extension vibration; and 56 denotes the characteristics of the second mode (TE2) of the thickness extension vibration.

Even when the top electrode 5 is composed of aluminum, as well as a case of FIGS. 12 to 18 where the top electrode 5 is composed of platinum, a dimensional relationship between the second mode (TE2) of the thickness extension vibration and the third mode (TS3) of the thickness shear vibration changes depending on the normalized $SiO_2$ thickness. Therefor, as well as a case of FIG. 26, FIG. 31 shows the normalized $SiO_2$ thickness in which the TS2 mode crosses the TS3 mode from the calculation results shown in FIGS. 28 to 30.

In the figures, reference numerals 57 and 58 denoted by broken lines designate a case where the top electrode 5 is composed of aluminum. For references, FIG. 31 illustrates a locus where the top electrode 5 shown in FIG. 26 is composed of platinum.

Figure 31:
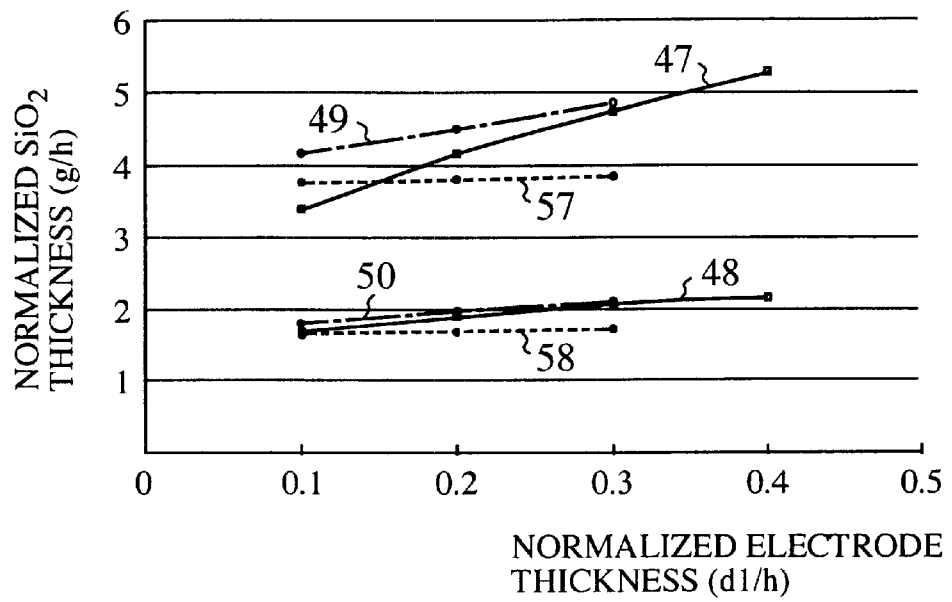
FIG. 31 is a graph showing the normalized $SiO_2$ thickness in which the TE2 mode crosses the TS3 mode of the film bulk acoustic wave device according to Embodiment 3 of this invention when the horizontal axis is designated as the normalized electrode thickness.
Figure 32:
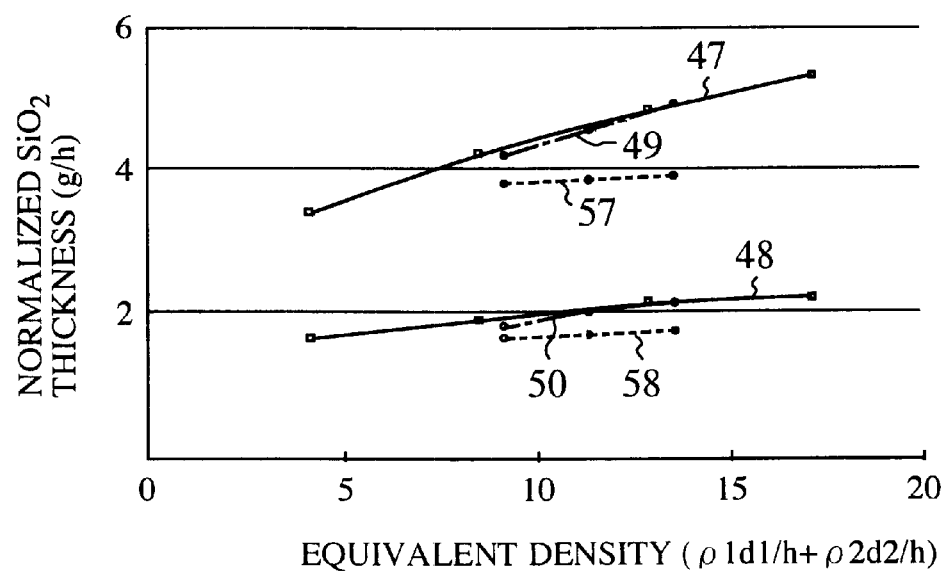
FIG. 32 is a graph showing the normalized $SiO_2$ thickness in which the TE2 mode crosses the TS3 mode of the film bulk acoustic wave device according to Embodiment 3 of this invention when the horizontal axis is designated as the equivalent density.

FIG. 32 designates where the graphs shown in FIG. 31 are plotted by the horizontal axis as the equivalent density R. As is apparent from FIG. 32, a locus of the top electrode 5 composed of aluminum is different from one of the top electrode 5 composed of platinum. This reason is as follows: since the aluminum density is greatly different from the platinum density, a relationship between the contribution due to the mass load and the contribution due to the top electrode 5 thickness differs largely in a case where the top electrode 5 is composed of either aluminum or platinum. In a case where the top electrode 5 is composed of aluminum in FIG. 32, when an approximate right line is determined from a locus exhibiting a larger value among the normalized $SiO_2$ thicknesses in which the TE2 mode crosses the TS3 mode, the following expression is provided: (g/h)=(0.023× R+3.57). In order to achieve an energy trapping possible film bulk acoustic wave device having the top electrode 5 composed of aluminum, it is required that the normalized $SiO_2$ thickness (g/h) should be set to (0.023×R+3.57) or more.

As described above, according to Embodiment 3, when the normalized $SiO_2$ thickness (g/h) is set to a value of (0.023×R+3.57) or more, an energy trapping possible film bulk acoustic wave device may be achieved by use of the second mode (TE2) of the thickness extension vibration. Further, the film bulk acoustic wave device has a larger electromechanical coefficient than the conventional type film bulk acoustic wave device, and little occurs the thickness shear vibration except the thickness extension vibration as a main vibration, thereby providing the characteristics of reduced losses or wider ranges as compared to the prior art.

However, the above-mentioned matter is applied similarly to a case where the top electrode 5 is composed of a titanium film formed on the piezoelectric film 17 and an aluminum film formed thereon.

The thickness of the silicon oxide to perform the energy entrapping possible film bulk acoustic wave device with the second mode (TE2) of the thickness extension vibration, as described in above, varies depending on the velocity of acoustic waves that propagates in an actual silicon oxide. The propagation velocity V that propagates in a medium is determined by $V=(c/\rho)^{0.5}$ from the velocity $\rho$ of the medium and the acoustic constant c.

Figure 33:
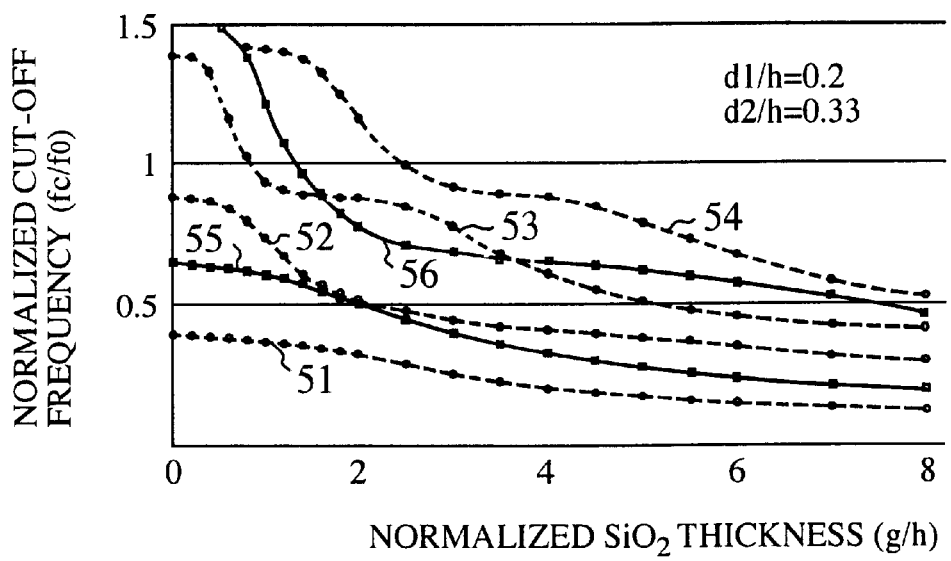
FIG. 33 is a graph showing the normalized cut-off frequency characteristics of the film bulk acoustic wave device according to Embodiment 3 of this invention when the acoustic constant is varied.

FIG. 33 shows the calculation results as well as FIG. 29 in a case where the acoustic constant c of the silicon oxide is multiplied by 0.9. When the acoustic constant c of the silicon oxide is multiplied by 0.9, the propagation velocity is decrease by about 5%. The normalized $SiO_2$ thicknesses in which the second mode (TE2) of the thickness extension vibration crosses the third mode (TS3) of the thickness shear vibration are 1.60 and 3.65, which are smaller by 4–5% as compared to the case of FIG. 29.

Figure 34:
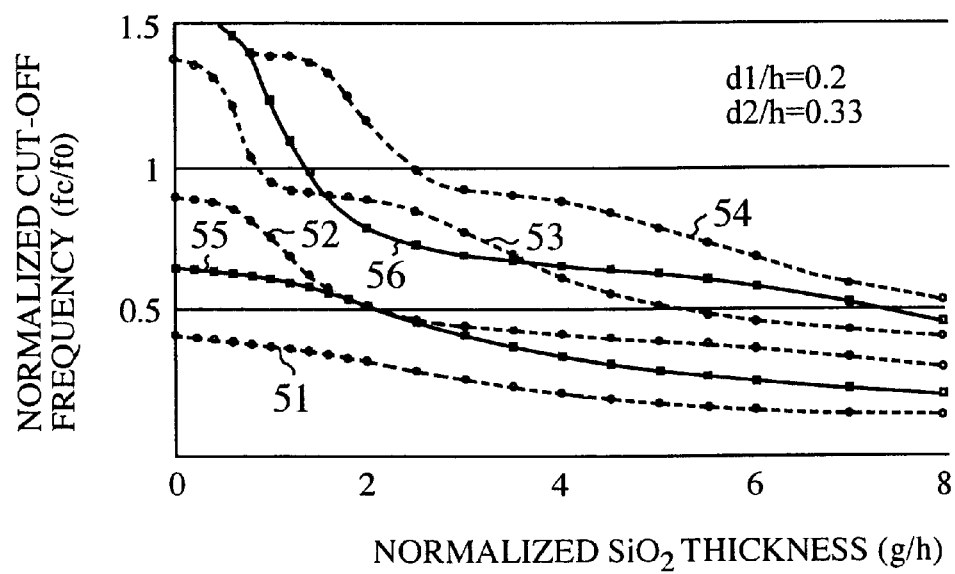
FIG. 34 is a graph showing the normalized cut-off frequency characteristics of the film bulk acoustic wave device according to Embodiment 3 of this invention when the density is varied.

FIG. 34 shows the calculation results as well as FIG. 29 in a case where the density $\rho$ of the silicon oxide is multiplied by 1.1. Also when the density $\rho$ of the silicon oxide is multiplied by 1.1, the velocity V is smaller by about 5%. The normalized $SiO_2$ thicknesses in which the second mode (TE2) of the thickness extension vibration crosses the third mode (TS3) of the thickness shear vibration are 1.63 and 3.66, which are smaller by about 4%.

Embodiment 4

Though the basic structure of a film bulk acoustic wave device of Embodiment 4 is the same as that shown in FIGS. 5 and 6, the bottom electrode 3 is composed of iridium (Ir) in Embodiment 4. The density of aluminum is 22500 (kg/m³).

The crystallinity of the iridium film of the bottom electrode 3, as in a case of the platinum film, greatly affects the crystallinity of the piezoelectric film 17, and is extremely important to create a favorable piezoelectric film 17. In a case where the piezoelectric film 17 is composed of lead titanate, the iridium film is especially applied to the bottom electrode 3, thus performing a lead titanate film with an extremely favorable crystallinity.

The density of iridium is 22400 (kg/m³), and extremely close to the density of platinum (21370 (kg/m³)). Therefor, when the locus of the normalized $SiO_2$ thicknesses in which the TE2 mode crosses the TS3 mode is found, it approximates to the loci of the solid lines 47 and 48 in FIG. 32. Therefore, in a case where the bottom electrode 3 is composed of iridium, and the top electrode 5 is composed of platinum, the normalized $SiO_2$ thickness (g/h) is set to (0.147×R+2.85) or more, thereby resulting in the same effect as Embodiment 2.

However, the above-mentioned matter is applied similarly to a case where the bottom electrode 3 is composed of a titanium film formed on the titanium film 21 and an iridium film formed thereon.

Embodiment 5

Though the basic structure of a film bulk acoustic wave device of Embodiment 5 is the same as that shown in FIGS. 5 and 6, the top electrode 5 is composed of aluminum in Embodiment 5 and the bottom electrode 3 is composed of iridium.

The aluminum density is 22500 (kg/m³), and close to the platinum density: 21370 (kg/m³). Therefor, when the locus of the normalized $SiO_2$ thicknesses in which the TE2 mode crosses the TS3 mode is found, it approximates to the loci of the solid lines 57 and 58 in FIG. 32. Therefore, in a case where the bottom electrode 3 is composed of iridium, and the top electrode 5 is composed of platinum, the normalized $SiO_2$ thickness (g/h) is set to (0.147×R+2.85) or more, thereby resulting in the same effect as Embodiment 3.

Embodiment 6

Though the basic structure of a film bulk acoustic wave device of Embodiment 6 is the same as that shown in FIGS. 5 and 6, the piezoelectric film 17 is composed of lead titanate-zirconate (PZT) in Embodiment 6.

The characteristics of PZT is similar to those of lead titanate, and a film bulk acoustic wave device having a piezoelectric film 16 composed of lead titanate-zirconate exhibits the same characteristics as those of FIGS. 12 to 18. Hence, when the locus of the normalized $SiO_2$ thicknesses in which the TE2 mode crosses the TS3 mode is found, almost the same results as FIG. 27 may be obtained. Therefore, in a case where the piezoelectric film 17 is composed of lead titanate-zirconate, the normalized $SiO_2$ thickness (g/h) is set to (0.147×R+2.85) or more, thereby resulting in the same effect as Embodiment 2.

In addition, in a where the piezoelectric film 17 is composed of lead titanate-zirconate, when the top electrode 5 is composed of aluminum, the normalized $SiO_2$ thickness (g/h) is set to (0.034×R+3.57) or more, thereby resulting in the same effect as Embodiment 2.

Embodiment 7

Figure 35:
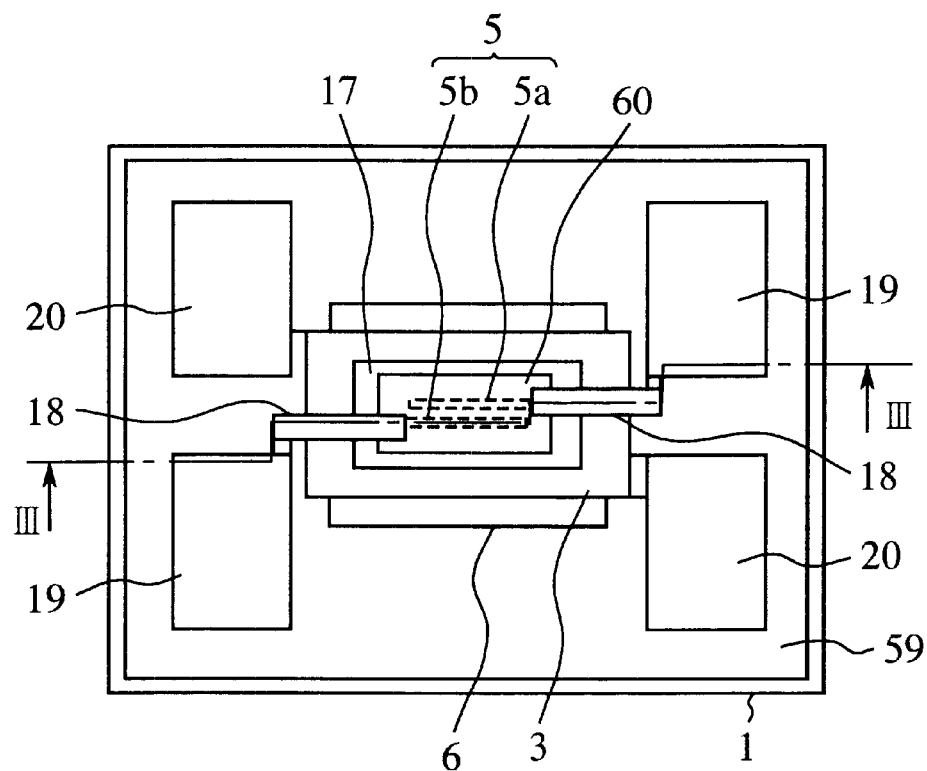
FIG. 35 is a top view showing a film bulk acoustic wave device according to Embodiment 7 of this invention.
Figure 36:
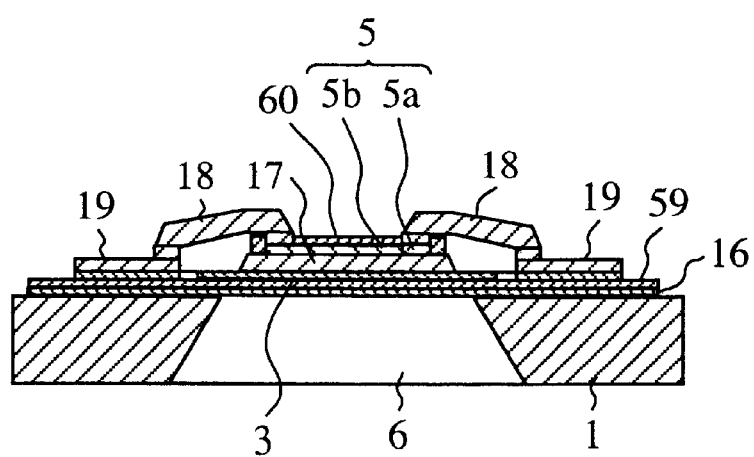
FIG. 36 is a cross sectional view showing the film bulk acoustic wave device according to Embodiment 7 of this invention.
Figure 37:
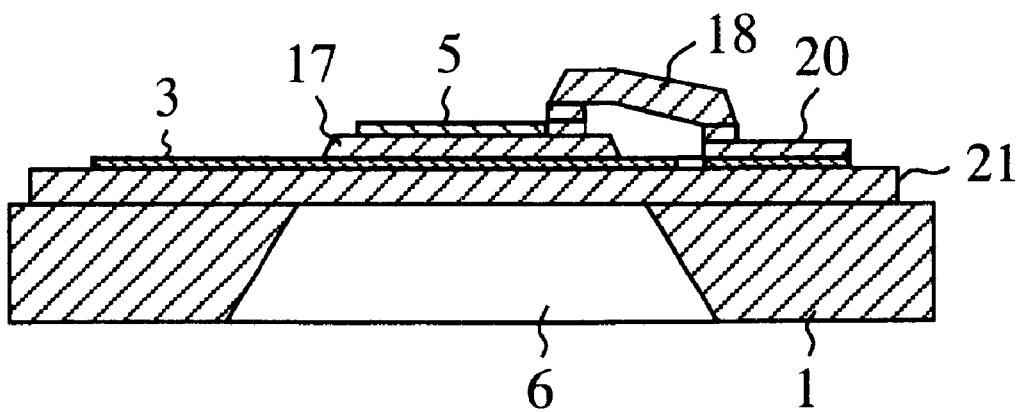
FIG. 37 is a cross sectional view showing a modification of the film bulk acoustic wave device.

FIGS. 35 and 36 are views showing a film bulk acoustic wave device according to Embodiment 7 of this invention. FIG. 35 is a top-side view, and FIG. 36 is a cross sectional view taken along line III—III. In the figure, reference numeral 17 denotes a piezoelectric film composed of lead titanate-zirconate; 59 denotes a first silicon oxide formed on the silicon nitride 16; and 60 denotes a second silicon film formed on the top electrode 5. Note that the same reference numerals are denoted with the same components as FIGS. 1 and 2.

This embodiment includes the first silicon oxide 59 formed on the silicon nitride 16 and the second silicon oxide 60 formed on the top electrode 5. In a case of such a structure, the thickness resonance occurs between the bottom surface of the silicon nitride 16 and the top surface of the second silicon film 60. When the sum of the thicknesses of the first silicon oxide 59 and the second silicon oxide 60 is set tog, the resonant frequency here may be found by the same calculation method as the case described in the aforementioned embodiment. That is, since it is assumed that the silicon oxide of a single layer is divided into two layers, an energy trapping possible film bulk acoustic wave device may be performed, e.g., without an operation to add an addition to lead titanate-zirconate.

In addition, in case of such a structure, finally, a fine adjustment for the thickness of the second silicon oxide 60 may contribute to adjust the errors in thickness upon fabrications, and simultaneously, to function effectively as a protective film, for example, in a case where the top electrode 5 is formed by a material with a poor corrosion resistance as compared to gold and platinum.

Though a case of the piezoelectric film 17 composed of lead titanate or lead titanate-zirconate is described in the above-described embodiment, the same effect may be obtained even in a case where it is composed of lithium tantalate. Further, in a piezoelectric film composed of a material having a one-third (0.33) or less in the Poisson's ratio and having a thickness extension vibration as a main vibration, the same effect may be also obtained.

In addition, in the aforementioned embodiment, the top electrode 5 and bottom electrode 3 is composed of a material such as platinum, iridium, aluminum. When it is composed of a conductor having a density of 10000 (kg/m$^3$) or more, the calculation results are approximately close to those of a case composed of platinum. The normalized $SiO_2$ thickness (g/h) is set to (0.147×R+2.85) or more, thereby resulting in the same effect as Embodiment 2. On the other hand, when it is composed of a conductor having a density of 10000 (kg/m$^3$) or less, the calculation results are approximately close to those of a case composed of aluminum. The normalized $SiO_2$ thickness (g/h) is set to (0.023×R+3.57) or more, thereby resulting in the same effect as Embodiment 3.

In addition, though the case of a silicon (Si) substrate used for a substrate is described in the aforementioned embodiment, the same effect may be obtained even in a semiconductor substrate such as gallium arsenide (GaAs) and a dielectric substrate such as magnesium oxide (MgO).

In addition, though the top electrode 5 is formed by separating the input-side electrode 5a from the output-side electrode 5b in the aforementioned embodiment, a single case is also possible.

Note that the above-described calculation method of the dispersion characteristics is described in detail in the literature, for example, "Supervised by Morio Onoue, The Basics of Solid Oscillation Theory, issued on September, 1982, Ohumu-sha, pp. 189–232".

In addition, for the material constants used for the calculations, the lead titanate is referred to the literature: "Neue Serie, ed.: Landolt-bornstein, pp.80, Springer-Verlag, Berlin, 1981", while the other are referred to the literatures: B. A. Auld, "Acoustic Fields and Waves in Solids", vol.I, pp.357–382, A Wiley-Interscience Publication, John Wiley & Sons, and National Astronomy Observatory, ed.: Science Chronological Table, 1997, pp. Phy/19(438), pp. Phy/26 (446)–27(447). As the constant of the materials used actually are not always equal to that described in these literatures, an appropriate $SiO_2$ thickness may be determined by a conversion based on a ratio between the literature value and the constant of actual materials.

Note that the mass represented as the normalized $SiO_2$ thickness may be not necessarily limited by silicon oxide if it is a dielectric, and silicon oxide may include SiO, not actually not genuine $SiO_2$.

As described above, the film bulk acoustic wave device according to this invention is adapted to prevent the breakdown of components on the etching to form a via hole, and simultaneously prevent the deterioration of the characteristics of the components due to the inner stress upon formation of the via hole.

In addition, the film bulk acoustic wave device is adapted to perform the characteristics of reduced losses and wider ranges.

What is claimed is:

1. A film bulk acoustic wave device comprising:
   a substrate;
   a dielectric film including a silicon nitride (SiN) formed on said substrate and a silicon oxide ($SiO_2$) on said silicon nitride;
   a bottom electrode formed on said dielectric film;
   a piezoelectric film formed on said bottom electrode; and
   a top electrode formed on said piezoelectric film,
   wherein a via hole is formed in such a manner that the thickness direction of a part of said substrate which is opposite to a region including a part where said top electrode exists is removed from the bottom surface of said substrate to a boundary surface with said silicon nitride.

2. The film bulk acoustic wave device according to claim 1, wherein the silicon oxide is formed separately on the silicon nitride and on the top electrode.

3. The film bulk acoustic wave device according to claim 1, wherein the piezoelectric film generates a thickness extension vibration as a main vibration, and in order to prevent the thickness of the silicon nitride from affecting the vibration characteristics, the thickness of the silicon oxide is larger than that of said silicon nitride, and 1.5 times or more the thickness of said piezoelectric film.

4. A film bulk acoustic wave device comprising:
   a substrate;
   a dielectric film formed on said substrate;
   a bottom electrode including a conductor formed on said dielectric film and having a density of 10000 (kg/m$^3$) or more;
   a piezoelectric film formed on said bottom electrode and which generates a thickness extension vibration as a main vibration; and
   a top electrode including a conductor formed on said piezoelectric film and having a density of 10000 (kg/m$^3$) or more,
   wherein when the thickness of said piezoelectric film is set to 2 h, the thickness of said dielectric film is set to g, the density of said top electrode is set to $\rho1 \times 1000$ (kg/m$^3$), the thickness of said top electrode is set to d1, the density of said bottom electrode is set to $\rho2 \times 1000$ (kg/m$^3$), the thickness of said bottom electrode is set to d2, and an equivalent density R is set to $R=(\rho1 d1/h)+(\rho2 d2/h)$,
   the normalized thickness (g/h) of said dielectric film determined by the thicknesses of said piezoelectric film and said dielectric film is {0.15×R+2.8} or more.

5. A film bulk acoustic wave device comprising:
   a substrate;
   a dielectric film formed on said substrate;
   a bottom electrode including a conductor formed on said dielectric film and having a density of 10000 (kg/m$^3$) or more;

a piezoelectric film formed on said bottom electrode and which generates a thickness extension vibration as a main vibration; and a top electrode including a conductor formed on said piezoelectric film and having a density of 10000 (kg/m$^3$) or less, wherein when the thickness of said piezoelectric film is set to 2h, the thickness of said dielectric film is set to g, the density of said top electrode is set to $\rho1\times1000$ (kg/m$^3$), the thickness of said top electrode is set to d1, the density of said bottom electrode is set to $\rho2\times1000$ (kg/m$^3$), the thickness of said bottom electrode is set to d2, and an equivalent density R is set to R=($\rho$1d1/h)+($\rho$2d2/h), the normalized thickness (g/h) of said dielectric film determined by the thicknesses of said piezoelectric film and said dielectric film is {0.023×R+3.5} or more.

6. The film bulk acoustic wave device according to claim 4, wherein the dielectric film has a silicon nitride (SiN) formed on the substrate, and a via hole is formed in such a manner that the thickness direction of a part of said substrate which is opposite to a region including a part where the top electrode exists is removed from the bottom surface of said substrate to a boundary surface with said silicon nitride.

7. The film bulk acoustic wave device according to claim 5, wherein the dielectric film has a silicon nitride (SiN) formed on the substrate, and a via hole is formed in such a manner that the thickness direction of a part of said substrate which is opposite to a region including a part where the top electrode exists is removed from the bottom surface of said substrate to a boundary surface with said silicon nitride.

8. The film bulk acoustic wave device according to claim 4, wherein a silicon oxide is formed separately on the substrate and on the top electrode.

9. The film bulk acoustic wave device according to claim 5, wherein a silicon oxide is formed separately on the substrate and on the top electrode.

10. The film bulk acoustic wave device according to claim 1, wherein the bottom electrode is mainly composed of either platinum (Pt) or iridium (Ir).

11. The film bulk acoustic wave device according to claim 4, wherein the bottom electrode is mainly composed of either platinum (Pt) or iridium (Ir).

12. The film bulk acoustic wave device according to claim 5, wherein the bottom electrode is mainly composed of either platinum (Pt) or iridium (Ir).

13. The film bulk acoustic wave device according to claim 3, wherein the piezoelectric film has as a main component either one of lead titanate (PbTiO$_3$), lead titanate-zirconate (PZT), lithium tantalate (LiTaO$_3$), and a material having a Poisson's ratio less than 0.33.

14. The film bulk acoustic wave device according to claim 4, wherein the piezoelectric film has as a main component either one of lead titanate (PbTiO$_3$), lead titanate-zirconate (PZT), lithium tantalate (LiTaO$_3$), and a material having a Poisson's ratio less than 0.33.

15. The film bulk acoustic wave device according to claim 5, wherein the piezoelectric film has as a main component either one of lead titanate (PbTiO$_3$), lead titanate-zirconate (PZT), lithium tantalate (LiTaO$_3$), and a material having a Poisson's ratio less than 0.33.

* * * * *